United States Patent [19]

Yagi et al.

[11] Patent Number: 4,777,719
[45] Date of Patent: Oct. 18, 1988

[54] APPARATUS FOR INSERTING ELECTRONIC COMPONENTS INTO PRINTED CIRCUITBOARDS

[75] Inventors: Hiroshi Yagi; Hisashi Fujita; Morikazu Kamoshida; Yoshio Harada; Keiichi Ihara, all of Tokyo, Japan

[73] Assignee: TDK Corporation, Japan

[21] Appl. No.: 833,349

[22] Filed: Feb. 25, 1986

[30] Foreign Application Priority Data

| Feb. 25, 1985 | [JP] | Japan | 60-34648 |
| Mar. 11, 1985 | [JP] | Japan | 60-33486[U] |
| Mar. 18, 1985 | [JP] | Japan | 60-37559[U] |
| Mar. 18, 1985 | [JP] | Japan | 60-37560[U] |
| Mar. 18, 1985 | [JP] | Japan | 60-37561[U] |
| Mar. 30, 1985 | [JP] | Japan | 60-45954[U] |
| Apr. 3, 1985 | [JP] | Japan | 60-49589[U] |
| Apr. 6, 1985 | [JP] | Japan | 60-51263[U] |
| Sep. 24, 1985 | [JP] | Japan | 60-144301[U] |
| Nov. 14, 1985 | [JP] | Japan | 60-174170[U] |

[51] Int. Cl.[4] .............................................. B23P 19/00
[52] U.S. Cl. .................................... 29/741; 29/564.1; 29/772; 414/222
[58] Field of Search .............. 29/739, 740, 741, 564.1, 29/771, 772; 414/222; 198/364.1, 465.1

[56] References Cited

U.S. PATENT DOCUMENTS

| 3,508,315 | 4/1970 | Hoffken | 29/741 |
| 4,063,347 | 12/1977 | Woodman, Jr. | 29/809 |
| 4,351,108 | 9/1982 | Johnson | 29/741 |
| 4,567,652 | 2/1986 | Gussman et al. | 29/741 |
| 4,609,319 | 9/1986 | Campisi et al. | 29/739 |

Primary Examiner—P. W. Echols
Attorney, Agent, or Firm—Steinberg & Raskin

[57] ABSTRACT

A simplified apparatus for automatically inserting electronic components of different forms into printed circuitboards successively conveyed along a travel path which extends along a horizontal plane includes a feed mechanism for separately and simultaneously feeding different pluralities of electronic components of different forms to a pallet operative for separately and simultaneously receiving and conveying the electronic components to an inserting device operative for separately and simultaneously inserting the electronic components into successive printed circuitboards, each board in its turn.

24 Claims, 39 Drawing Sheets

FIG.11
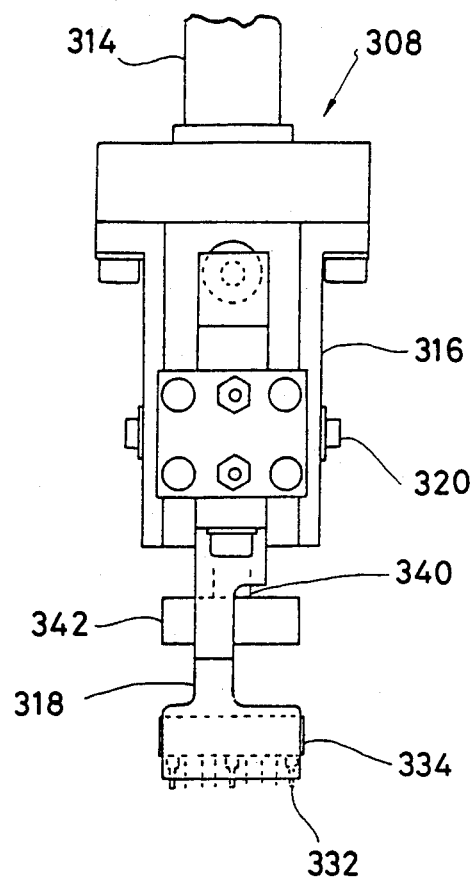
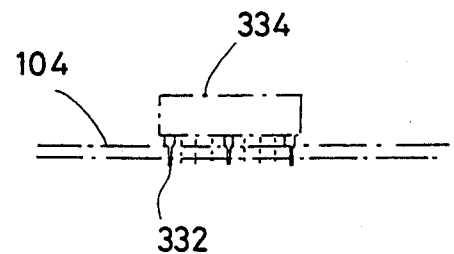

FIG.13
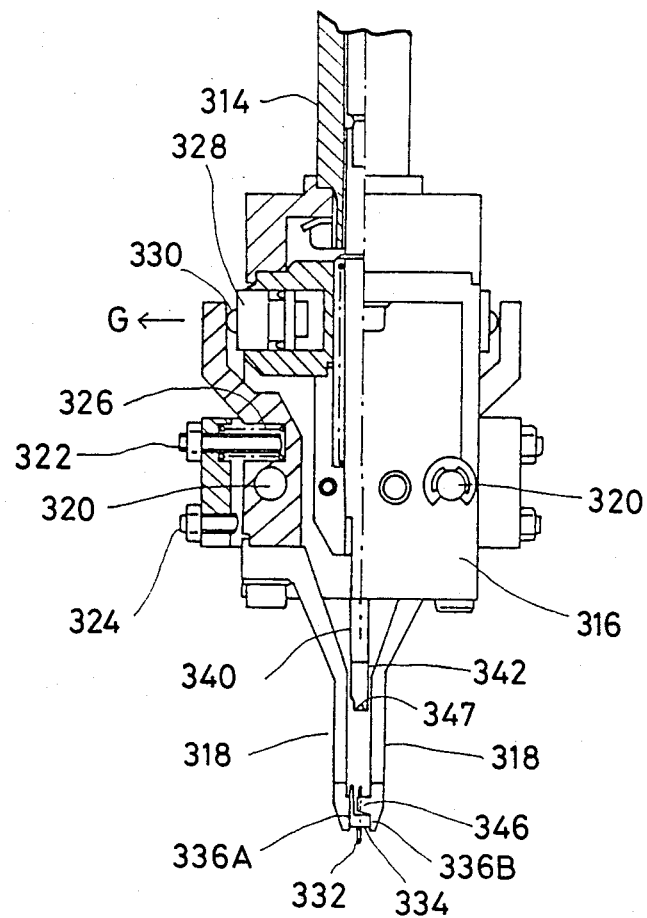
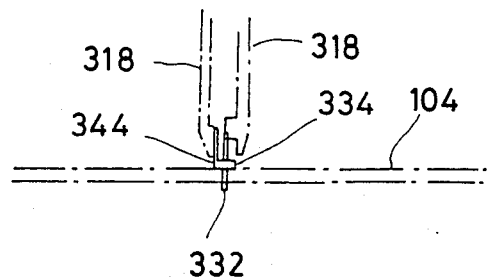

FIG.14
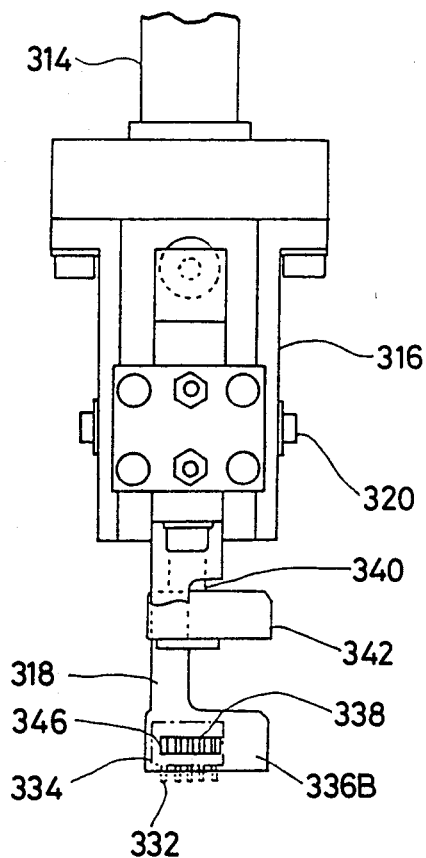
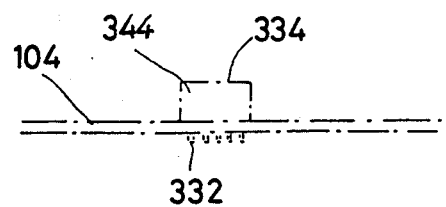

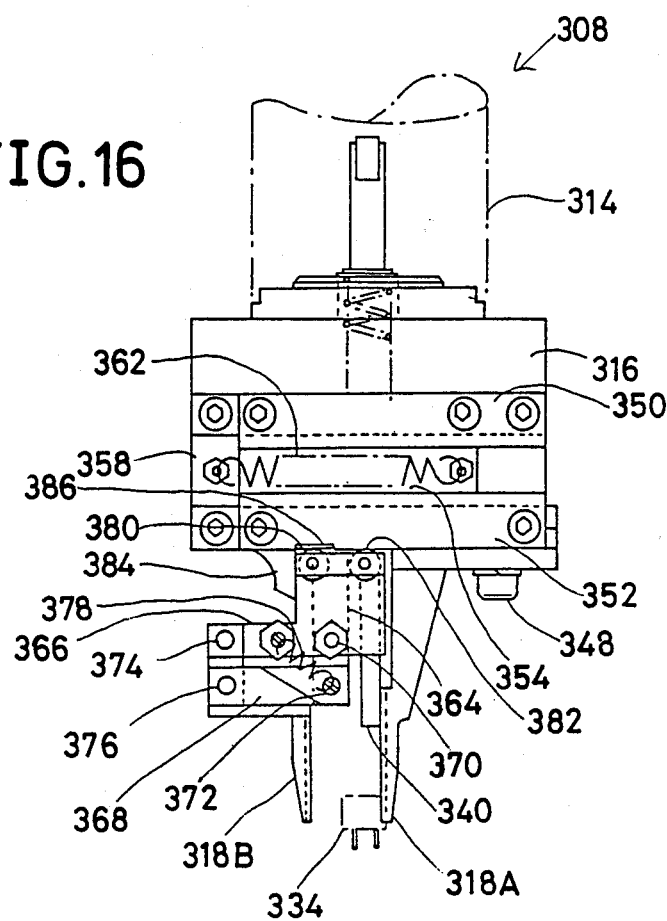
FIG.16
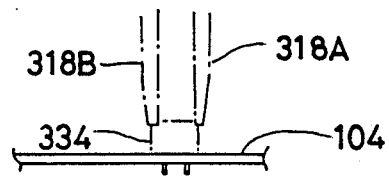

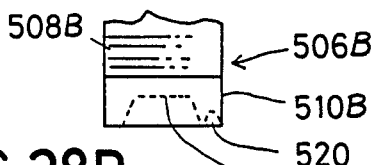
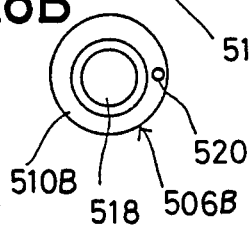
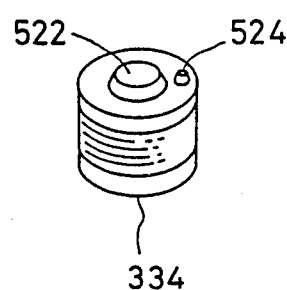
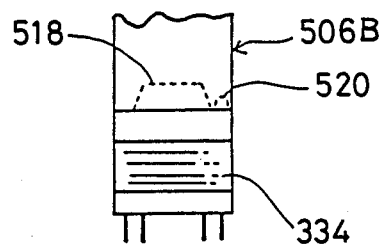

4,777,719

APPARATUS FOR INSERTING ELECTRONIC COMPONENTS INTO PRINTED CIRCUITBOARDS

BACKGROUND OF THE INVENTION

1. Field of the Invention

This invention generally relates to an apparatus for inserting electronic components and, more particularly, to an electronic component inserting apparatus which is adapted to automatically insert electronic components of different forms such as dual-in-line type package integrated circuits (DIP-ICs), single-in-line type package integrated circuits (SIP-ICs), intermediate frequency transformers (IFTs), pin connectors, and the like into successive printed circuitboards.

2. Description of the Prior Art

A conventional apparatus for inserting electronic components of different forms of this general type has been disclosed in Japanese Patent Application Laid-Open Publication No. 75887/1983 which was assigned to the same assignee as the instant application. This conventional apparatus is operative to vertically hold, in a sequencer, magazines which receive electronic components of different forms therein and which are superposed on one another in a predetermined manner, to select desired electronic components from the magazines by means of the sequencer, to transfer the selected electronic components one by one to at least one predetermined insertion position by means of a chuck, and to insert the electronic components into each printed circuitboard at the insertion position.

Although generally satisfactory for its intended purpose, the conventional electronic component inserting apparatus, unfortunately, has a disadvantage that when a plurality of insertion positions are provided, it is required to provide a plurality of sequencers corresponding in number to the number of insertion positions, thereby resulting in the apparatus being highly complicated in structure. Also, another disadvantage with the known apparatus is that each of the sequencers is limited in its capacity to receive the magazines therein.

SUMMARY OF THE INVENTION

1. Objects of the Invention

It is the general object of the present invention to overcome the above-described disadvantages of the prior art inserting apparatus.

It is another object of the present invention to provide a simplified apparatus for automatically inserting electronic components into successive printed circuitboards, even when the electronic components to be inserted into each printed circuitboard have many different forms and are numerous.

It is still another object of the present invention to provide a plurality of insertion heads, each simultaneously serving to insert electronic components of different forms into each printed circuitboard.

2. Brief Description of the Invention

In keeping with these objects, and others which will become apparent hereinafter, one feature of this invention resides, briefly stated, in an apparatus for automatically inserting electronic components of different forms into printed circuitboards successively conveyed along a travel path. A plurality of workstations are arranged along the travel path.

The apparatus advantageously comprises means for separately and simultaneously feeding different pluralities of electronic components of different forms to pallet workstations. Each plurality of electronic components has the same form. By way of example, the first plurality of electronic components may be integrated circuits whose leads are of the dual-in-line type (DIP-ICs). The second plurality of electronic components may be integrated circuits whose leads are of the single-in-line type (SIP-ICs). The third plurality of electronic components may all be intermediate frequency transformers (IFTs). The fourth plurality of electronic components may be pin connectors. Countless other types and forms of electronic components can be inserted into printed circuitboards in accordance with this invention.

Pallet means are provided at the pallet workstations for separately and simultaneously receiving the different pluralities of electronic components. The pallet means are operative for separately and simultaneously conveying the different pluralities of electronic components to insertion workstations.

The apparatus still further comprises inserting means at the insertion workstations for separately and simultaneously inserting the different pluralities of electronic components at the insertion workstations into successive printed circuitboards, each board in its turn.

Advantageously, the inserting means includes a plurality of insertion heads corresponding in number to the different pluralities of electronic components. Each insertion head includes means for holding electronic components of one form. The insertion heads are simultaneously operative to insert the held electronic components of different forms into each printed circuitboard.

Advantageously, the feeding means feeds the electronic components in an inclined manner and, preferably, at an angle of 45 degrees relative to the horizontal plane along which the travel path extends. The pallet means includes a plurality of carriers inclinably arranged to receive the electronic components in an inclined manner from the feeding means.

In accordance with this invention, it is no longer necessary to provide a plurality of sequencers as taught by the known conventional inserting apparatus, which sequencers correspond in number to the number of electronic components of different type to be inserted into each printed circuitboard. The resulting apparatus is greatly simplified and has an increased capacity to receive and hold electronic components.

The novel features which are considered as characteristic of the invention are set forth in particular in the appended claims. The invention itself, however, both as to its construction and its method of operation, together with additional objects and advantages thereof, best will be understood from the following description of specific embodiments when read in connection with the accompanying drawings.

BRIEF DESCRIPTION OF THE DRAWINGS

FIG. 11 is a side view of the insertion head unit shown in FIG. 10;

FIG. 13 is a front view partly in section showing a modification of an insertion head unit;

FIG. 14 is a side view of the insertion head unit shown in FIG. 13;

FIG. 16 is a front view showing another modification of an insertion head unit;

FIG. 28A is a front view showing another modification of an insertion chuck unit;

FIG. 28B is a bottom view of the insertion chuck unit shown in FIG. 28A;

FIG. 29 is a perspective view showing an electronic component handled by the insertion chuck unit shown in FIG. 28;

FIG. 30 is a front view showing the operation of the insertion chuck unit shown in FIG. 28A;

DETAILED DESCRIPTION OF THE PREFERRED EMBODIMENTS

Figure 1:
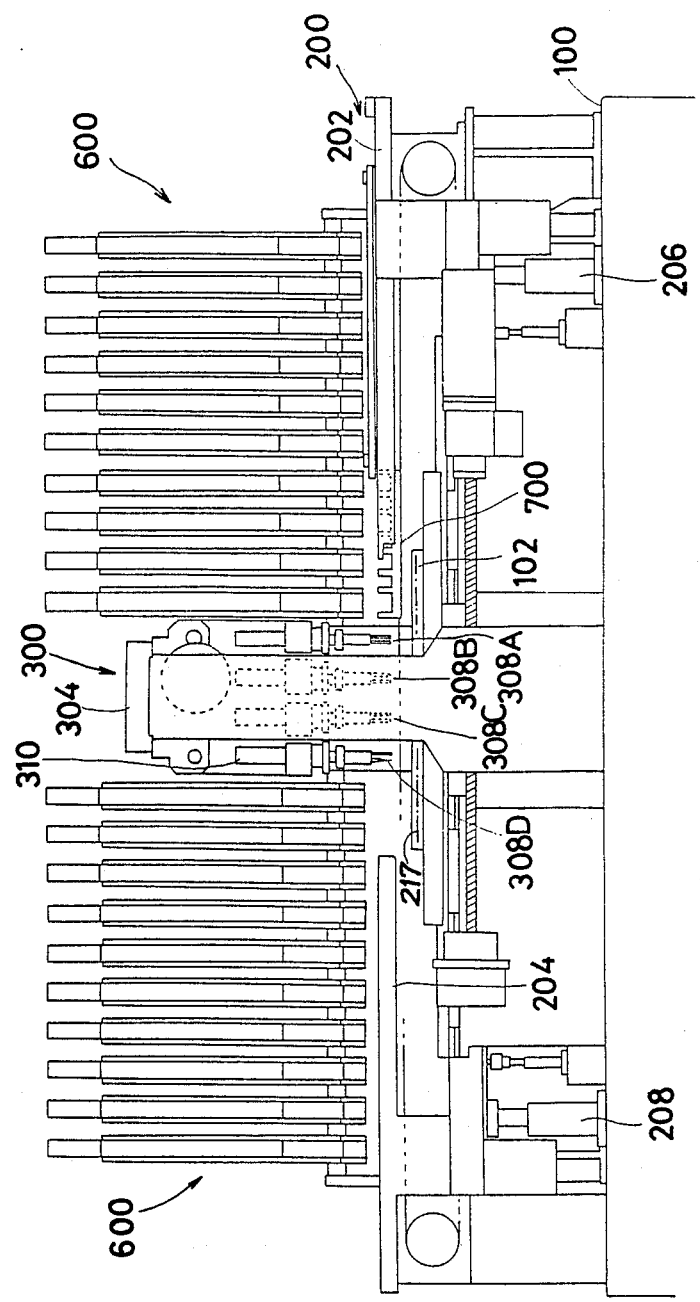
FIG. 1 is a front view generally showing an embodiment of an apparatus for inserting electronic components into printed circuitboards according to the present invention.

Referring now to the drawings, an apparatus for inserting electronic components according to the present invention will be described hereinafter.

Figure 2:
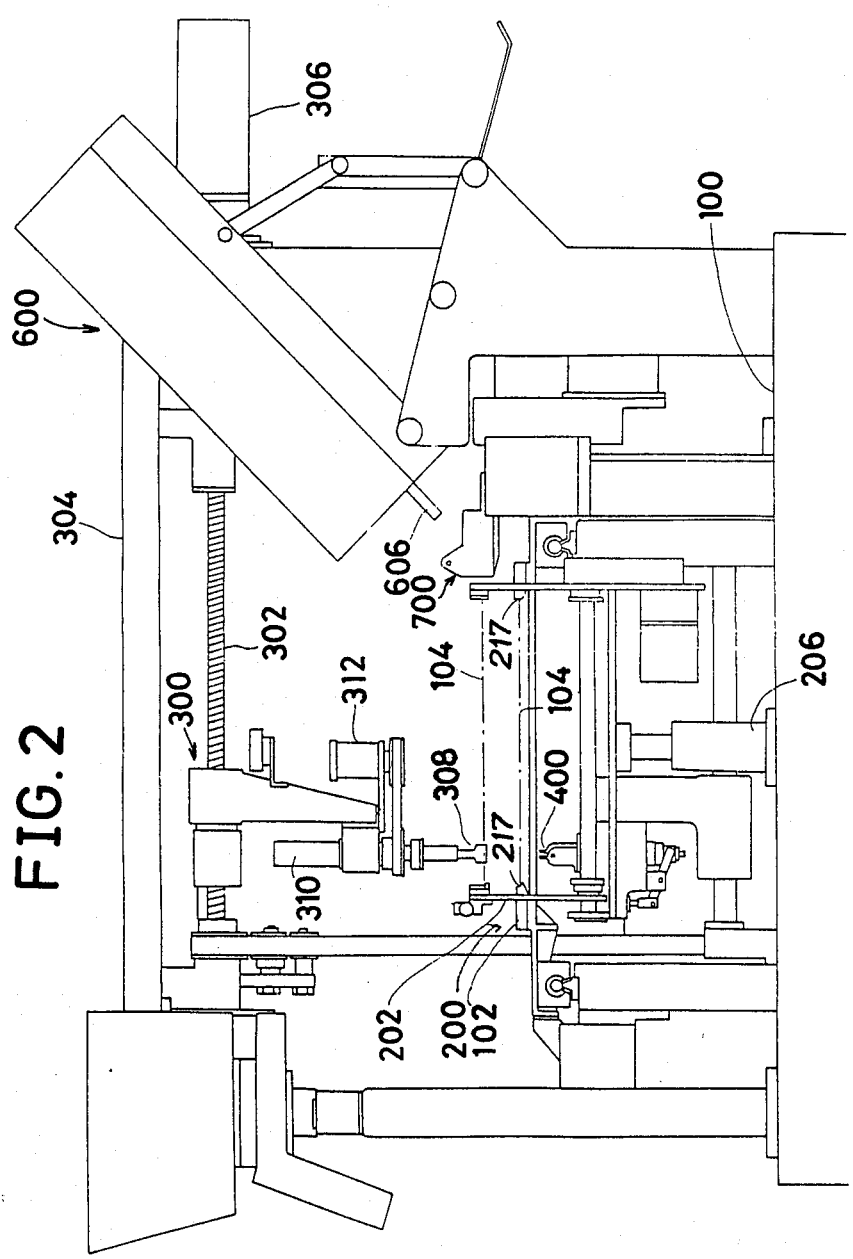
FIG. 2 is a side view of the apparatus shown in FIG. 1.

FIGS. 1 and 2 generally show an embodiment of an electronic component inserting apparatus according to the present invention. An inserting apparatus of the illustrated embodiment, as shown in FIGS. 1 and 2, includes a base 100, an X-table 102 horizontally arranged on the base 100 to put a printed circuitboard 104 thereon, and a mechanism for feeding a printed circuitboard to the X-table 102, which is generally indicated by reference numeral 200.

In the illustrated embodiment, the X-table 102 is adapted to be moved only in the X-direction, above which a mechanism for inserting electronic components into a printed circuitboard, which is generally designated by reference numeral 300, is disposed in a manner to be movable in the Y-direction perpendicular to the X-direction. More particularly, a threaded shaft 302 extending in the Y-direction is rotatably supported on a support frame 304 vertically mounted on the base 100 and is threadedly engaged with the electronic component inserting mechanism 300, and a motor 306 is mounted on the support frame 304 to rotatingly drive the threaded shaft 302.

The inserting mechanism 300 is equipped with a plurality of insertion head units 308 for inserting electronic components into a printed circuitboard. In the illustrated embodiment, it has four insertion head units 308A-308D provided at fixed intervals. The insertion head units 308A-308D are adapted to clamp electronic components of shapes different from one another, respectively. For example, the units 308A-308D may be constructed to clamp a dual-in-line type IC, an SIP-IC, an IFC and a pin connector, respectively, and then insert them into a printed circuitboard.

Corresponding to the arrangement of the electronic component insertion head units 308A-308D, the inserting mechanism 300 is provided with air cylinders 310 and 312 for vertically moving the insertion head units 308A-308D and turning the direction of the units, respectively.

The electronic component inserting apparatus of the illustrated embodiment also includes a clinch mechanism 400 which is arranged below the X-table 102 so as to serve to bend leads of electronic components inserted into a printed circuitboard and is adapted to be moved corresponding to the movement of the insertion head units 308.

The inserting apparatus of the illustrated embodiment also includes an electronic component feed mechanism 600 and a pallet mechanism 700 for receiving an electronic component from the feed mechanism 600 and delivering it to the electronic component inserting mechanism 300.

Now, the mechanisms of the apparatus will be detailedly described hereinafter.

Printed Circuitboard Feed Mechanism:

In the embodiment shown in FIGS. 1 and 2, the printed circuitboard feed mechanism 200 comprises an updown feed conveyor 202 provided on one side of the X-table 102 to feed a printed circuitboard 104 to the X-table 102, and an up-down discharge conveyor 204 provided on the other side of the X-table to discharge a printed circuitboard from the X-table. In FIG. 1, the conveyors 202 and 204 are disposed in the right and left sides of the X-table 102, respectively. The up-down feed and discharge conveyors 202 and 204 are adapted to be vertically movable by means of air cylinders 206 and 208 and positioned at the same level as the X-table 102 only when they feed and discharge a printed circuitboard to and from the X-table 102, respectively. In the other situations, the conveyors 202 and 204 each are positioned at a level higher than that of the X-table 102 to permit the X-table to be moved in the X-direction.

The mechanism 200 may be constructed in such a manner as shown in FIGS. 3 to 9.

Figure 3:
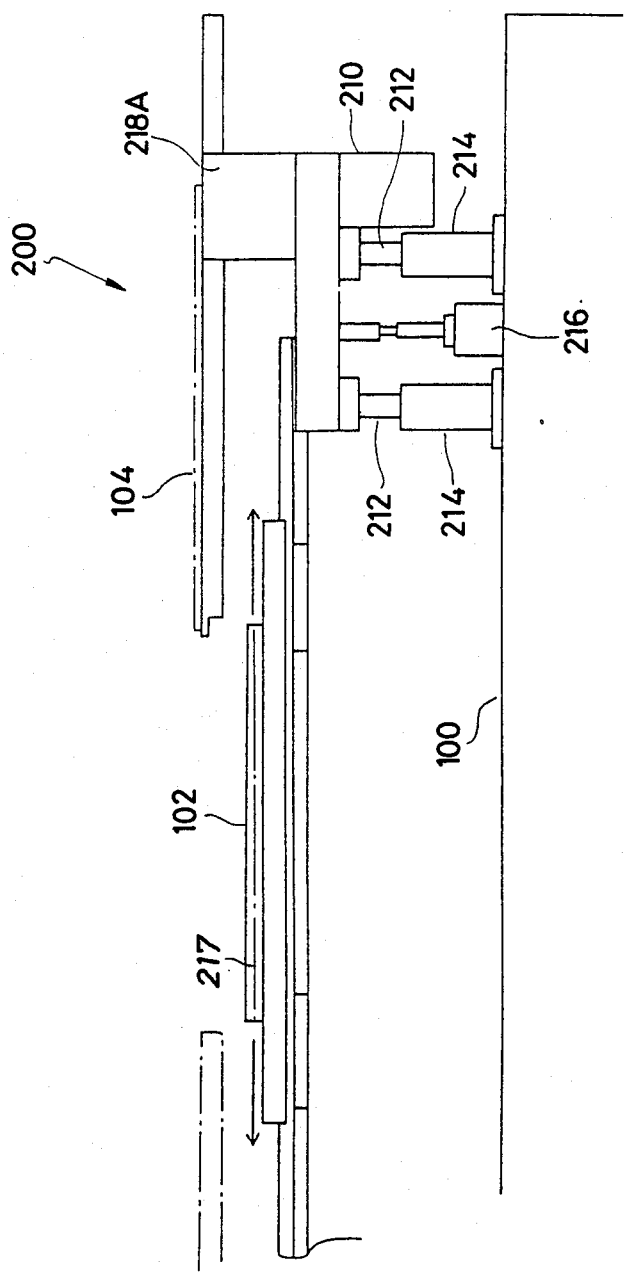
FIG. 3 is schematic front view showing a printed circuitboard feed mechanism.
Figure 4:
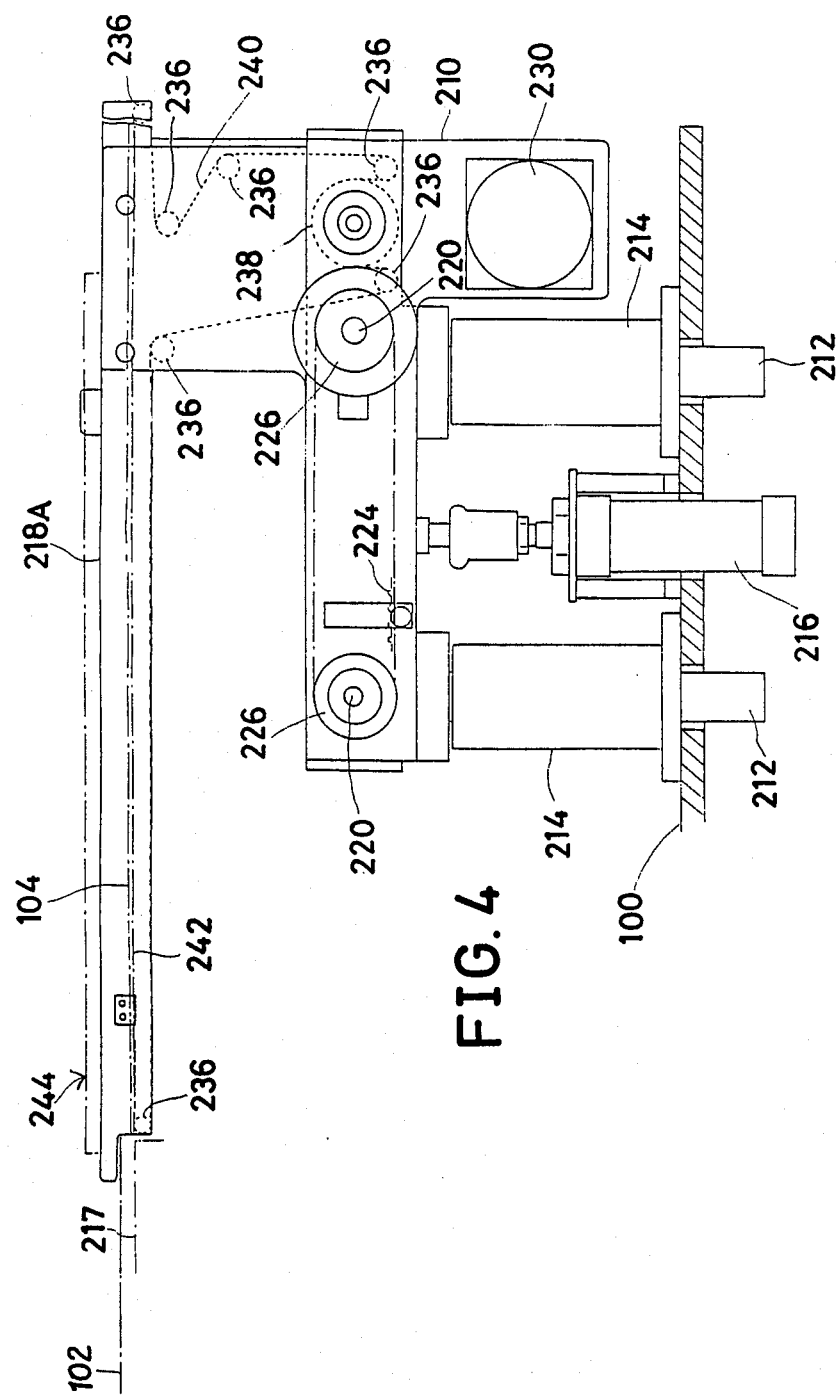
FIG. 4 is a front view of the printed circuitboard feed mechanism shown in FIG. 3.
Figure 5:
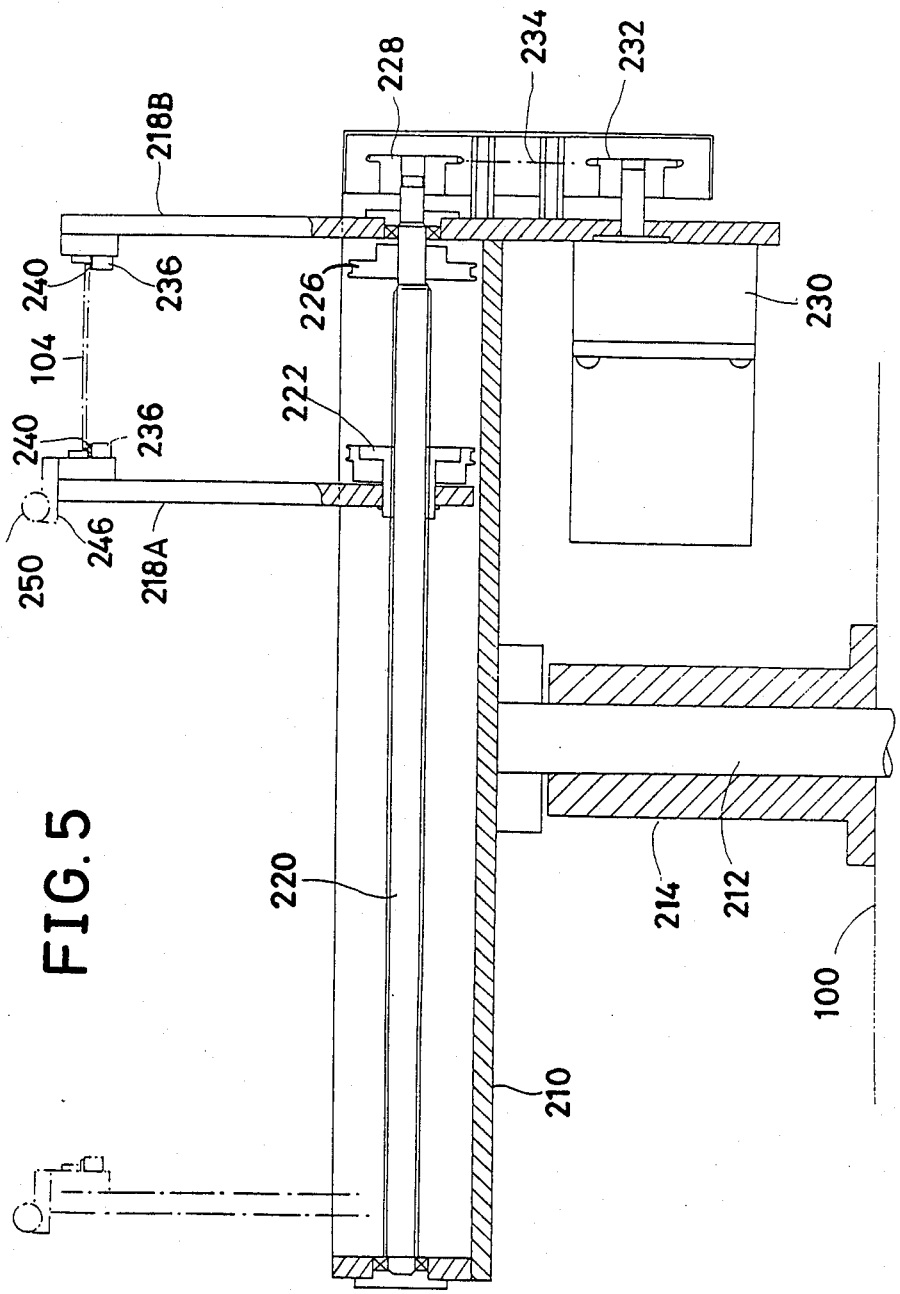
FIG. 5 is a side sectional view of the printed circuitboard feed mechanism shown in FIG. 3.

A printed circuitboard feed mechanism 200 of the modification, as shown in FIGS. 3 to 5, includes a frame 210, vertical guide rods 212 each fixed at an upper end thereof on a bottom surface of the frame 210. The vertical guide rods 212 each are supported at a lower end thereof on a ball bushing or a thrust bearing 214 fixed on the base 100 so that it may be vertically slid. Also, the mechanism 200 includes an air cylinder 216 which is provided between the frame 210 and the base 100 to vertically move the frame 210. In the modification, the X-table 102 includes a rail 217 which is capable of receiving a printed circuitboard supported at a lowered position of the frame 210.

The frame 210, as best shown in FIG. 5, includes a pair of vertical frame sections 218A and 218B facing opposite to each other. The vertical frame section 218A forming a front surface of the frame 210 is movable in the longitudinal direction of the frame, whereas the vertical frame section 218B is stationary and constitutes a rear surface of the frame 210. The reason why the vertical frame portion 218A is movably constructed is for the purpose of adjusting the distance between the sections 218A and 218B depending upon the width of the printed circuitboard 104. More particularly, the frame 210 has two parallel threaded shafts 220 supported thereon so as to extend in the longitudinal direction of the frame, and the vertical frame 218A has threaded bearings 222 provided so as to be engagedly fitted on the threaded shafts 220. The threaded shafts 220, as shown in FIG. 4, are adapted to be actuated together by means of a timing belt 224 stretched between pulleys 226 mounted on ends of the threaded shafts 220. Also, one of the shafts 220, as shown in FIG. 5, has a sprocket 228 mounted on the other end thereof, so that reversible driving force of a motor 230 mounted on the frame 210 may be transmitted through a sprocket 232 of the motor, an endless chain 234 wound between the sprockets 228 and 232, and the sprocket 232 to the shaft. The vertical frame section 218A is moved by means of the motor 230 depending upon the width of a printed circuitboard 104, as indicated by dashed lines in FIG. 5.

The vertical frame sections 218A and 218B, as shown in FIGS. 4 and 5, are provided on each of inner facing surfaces thereof opposite to each other with a plurality of pulleys 236 and a pulley 238. The pulleys 236 and pulley 238 of each of the vertical frame sections are operationally engaged with one another in turn by means of a conveyor belt 240. The conveyor belts 240 each are then guided to the upper portion of the vertical frame section and horizontally extend along an upper horizontal portion of the sections 218A, 218B. A printed circuitboard 104 is adapted to be supported at both sides thereof on the upper horizontally extending portions 242 of the conveyor belts. The pulley 238 is driven by a motor different from that for the pulleys 236.

The printed circuitboard feed mechanism 200 further includes a unit for pushing out a printed circuitboard toward the X-table 102, which is generally designated by reference numeral 244 and detailedly shown in FIGS. 6 to 9. The printed circuitboard pushing unit 244 includes a guide plate 246 fixed on the vertical frame section 218A, which has a guide groove 248 (FIG. 8) formed along the upper horizontal portion of the section 218A. On or above the guide groove 248 is arranged a spline shaft 250 so as to be rotatable and slidable in the axial direction thereof. The spline shaft 250 has a first claw member 252 (see FIG. 8) fixedly connected to one end (front end) thereof through a first arm 254 and a second claw member 256 (see FIG. 9) to the other end (rear end) thereof through a second arm 258.

To the guide plate 246 is fixed an air cylinder 259 (see FIG. 6), on which a piston rod 260 is connected through a connecting plate 262 to the front end of the spline shaft 250. Also, the spline shaft 250 is pivotably connected to the connecting plate 262 so that it may be freely rotated.

Figure 7:
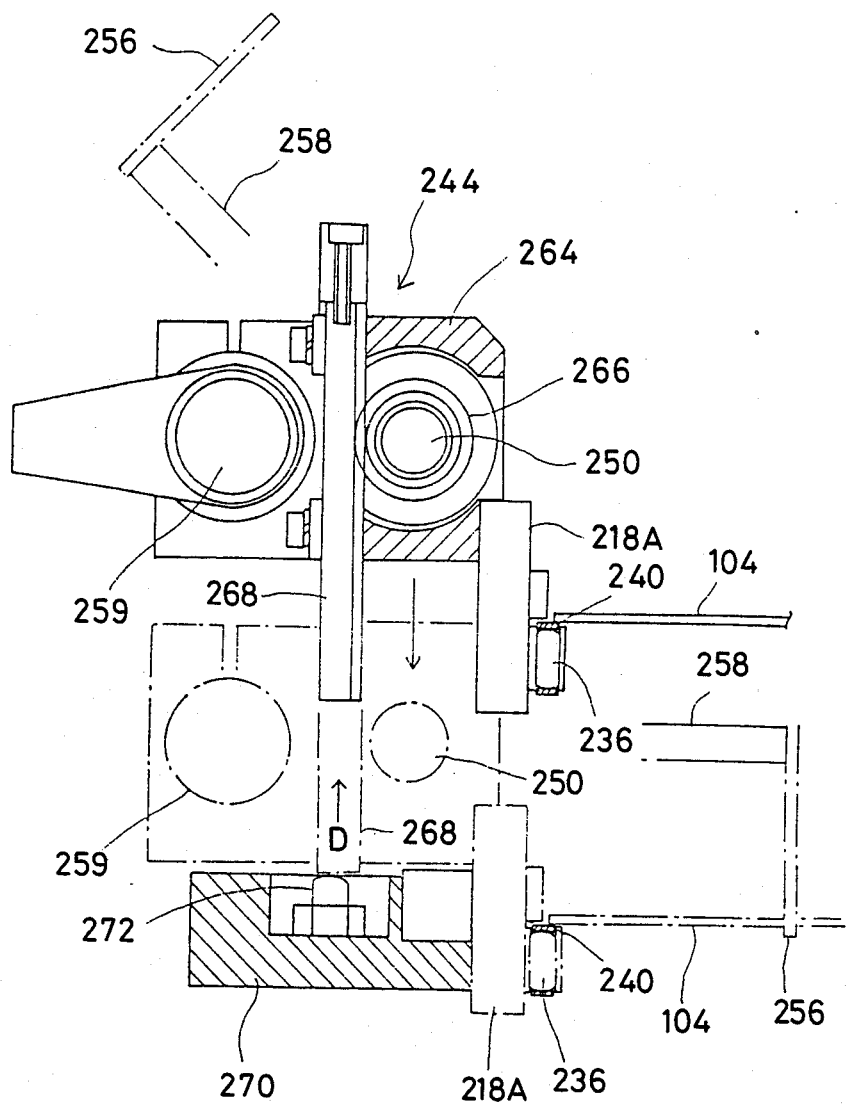
FIG. 7 is a sectional view taken along line VII—VII in FIG. 6.
Figure 8:
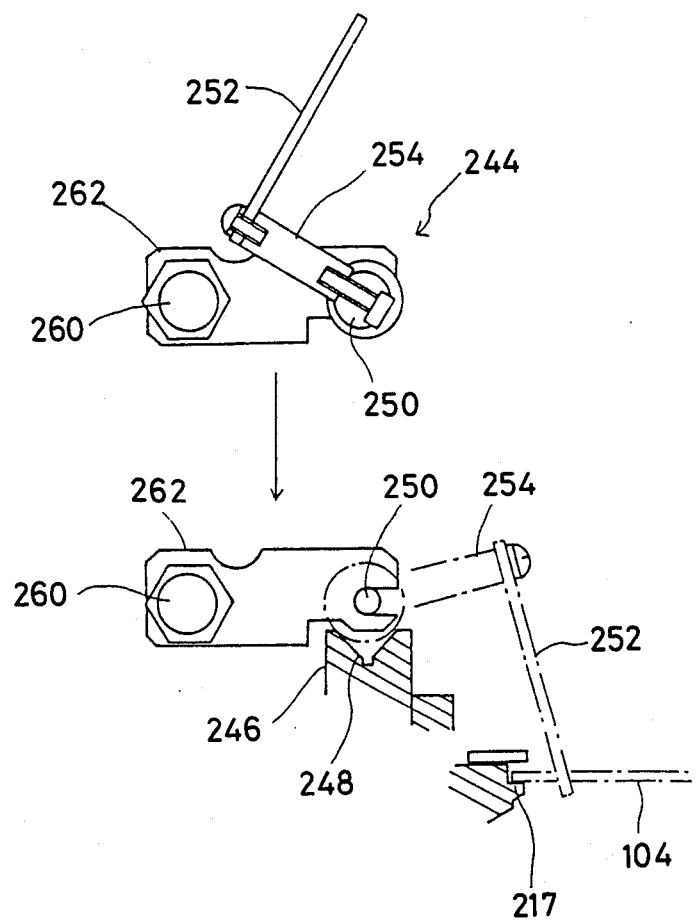
FIG. 8 is a sectional view taken along line VIII—VIII in FIG. 6.
Figure 9:
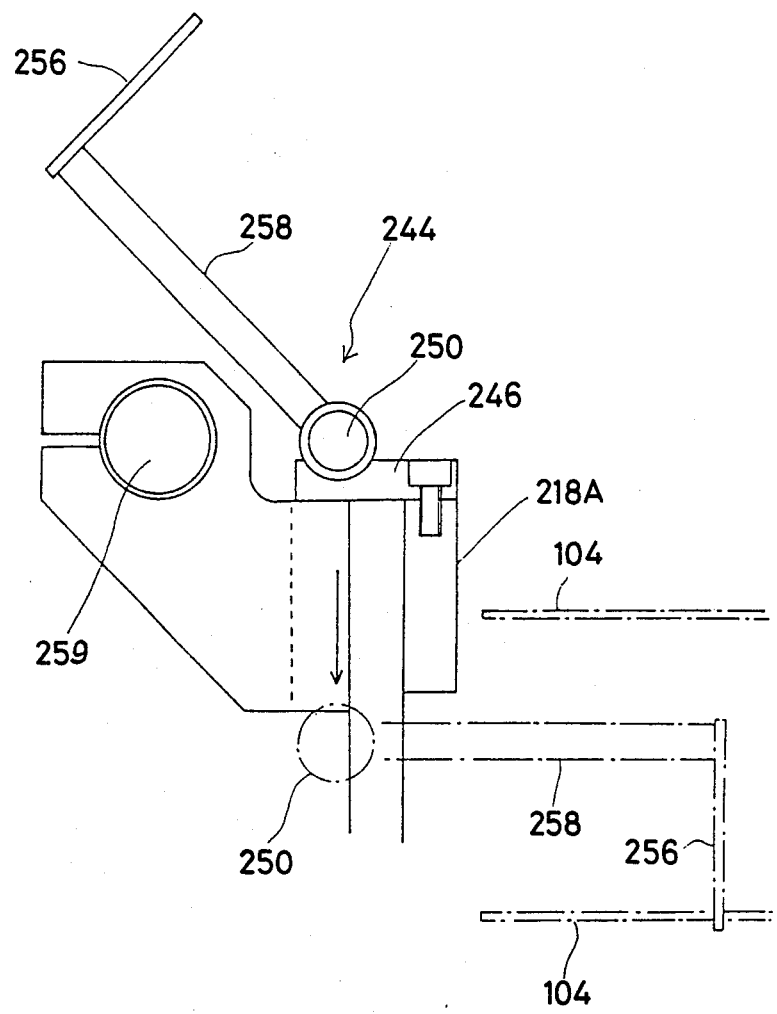
FIG. 9 is a sectional view taken along line IX—IX in FIG. 6.

The spline shaft 250 extends through a gear support block 264 fixed on the guide plate 246 and has a pinion 266 fitted thereon in the support block 264, as shown in FIG. 7, and a rack 268 engaged with the pinion 266 is provided to be vertically movable with respect to the gear support block 264. The pinion 266 is axially slidable so as not to prevent the axial movement of the spline shaft 250, and the rack 268, as indicated by dashed lines in FIG. 7, is downwardly forced by means of a spring (not shown).

Figure 6:
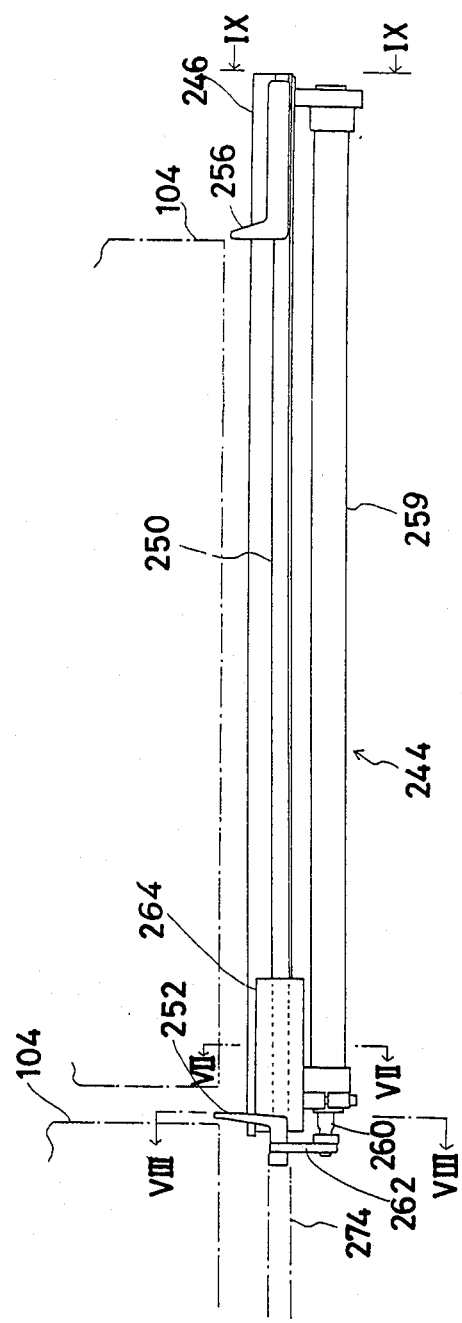
FIG. 6 is a plan view showing a mechanism for pushing out a printed circuitboard in the printed circuitboard feed mechanism shown in FIG. 3.

Also, as shown in FIG. 7, a stopper block 270 is arranged on an outside of the vertical frame section 218A to be kept at a constant vertical position or height irrespective of the vertical movement of the vertical frame sections 218A and 218B. The stopper block 270 is provided with a stopper bolt 272 which is adapted to be abutted against a lower end surface of the rack 268. For the purpose of forwardly and movably guiding the spline shaft 250, the X-table 102 is provided with a guide groove 274 (see (FIG. 6).

Now, the manner of operation of the printed circuitboard feed mechanism 200 constructed as described above will be described hereinafter.

The air cylinder 216 extends during the operation of the X-table 102, so that the frame 210 may be at the raised position, as shown in FIG. 3. This results in the frame 210 ensuring the smooth movement of the X-table 102. At the raised position of the frame 210, the first and second claw members 252 and 256 each are raised at a distal end thereof as indicated by solid lines in FIGS. 8 and 9, so that they may not be engaged with the printed circuitboard 104. At this time, the conveyor belt 240 is actuated to set a subsequent printed circuitboard fed from a printed circuitboard feed unit (not shown) at a predetermined position between the first and second claw members 252 and 256 and then stopped.

While the movement of the X-table 102 is stopped in order to feed the next printed circuitboard, the frame 210 is at the lowered position as shown in FIGS. 4 and 5, so that the upper horizontal portion of each of the conveyor belts 240 on which a printed circuitboard is supported is at the same height as the rail 217 (FIGS. 4 and 8) of the X-table 102 for supporting a printed circuitboard thereon. At the lowered position, the rack 268 in the gear support block 264 abuts against the stopper bolt 272 as indicated by dashed lines in FIG. 7 and is movable as indicated by an arrow D, to thereby rotate the pinion 266 engaged therewith in the clockwise direction. This results in the spline shaft 250 being rotated in the same direction, so that the first and second claw members 252 and 256 each may be ready to be engaged with a rear end of a printed circuitboard 104 as indicated by dashed lines in FIGS. 8 and 9. More particularly, the first claw member 252 is engaged with a printed circuitboard which is placed on the rail 217 of the X-table to be fed to a predetermined central position of the X-table, and the second claw member 256 is engaged with a subsequent printed circuitboard fed from the printed circuitboard feed unit onto the conveyor belts 240. Thereafter, the air cylinder 259 is actuated to cause the piston rod 260 to extend, so that the spline shaft 250 and the claw members 252 and 256 may be moved in the direction of movement of a printed circuitboard. This results in the first claw member 252 transferring the printed circuitboard 104 to the predetermined central position of the X-table 102 and the second claw member 256 feeding the subsequent printed circuitboard 104 to the end of the rail 217 of the X-table 102.

Thus, it will be noted that the printed circuitboard feed mechanism 200 is capable of readily and positively feeding a printed circuitboard to the X-table.

Electronic Component Inserting Mechanism:

Now, the insertion head unit 308 for the electronic component inserting mechanism 300 described above will be described.

Figure 10:
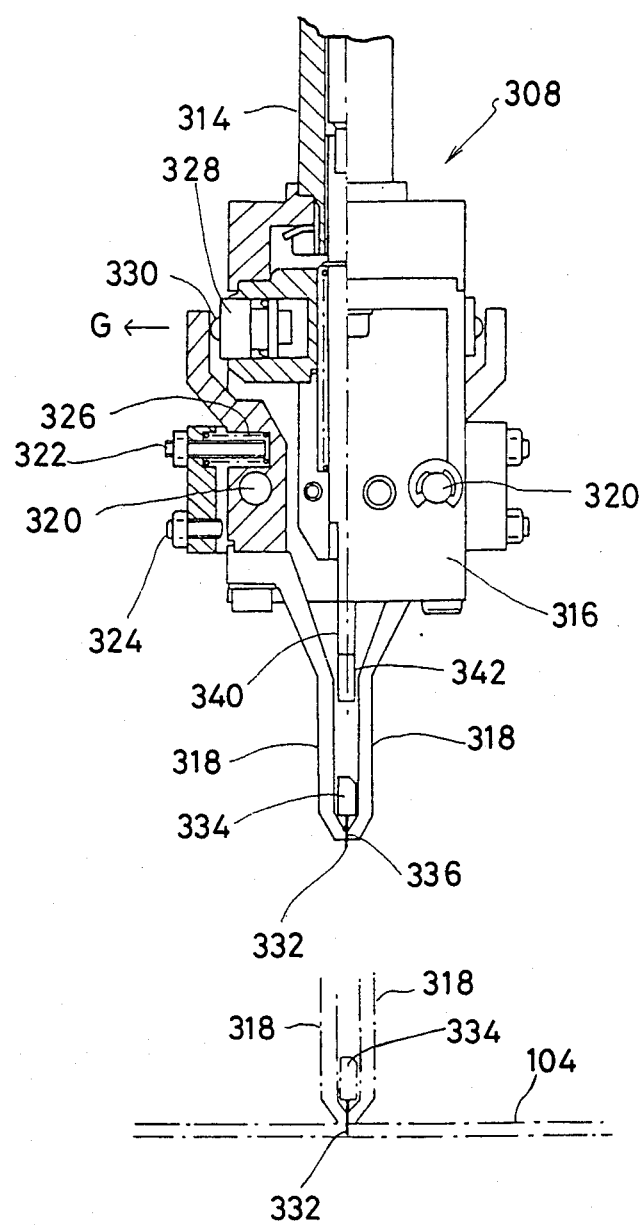
FIG. 10 is a front view partly in section showing an insertion head unit suitable for use for an electronic component inserting mechanism.
Figure 12:
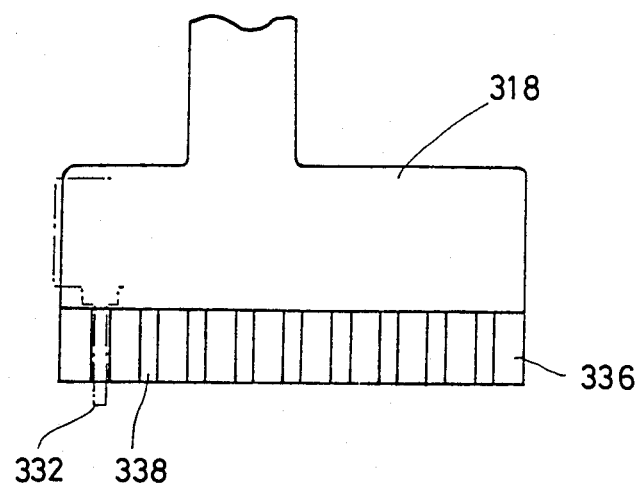
FIG. 12 is an enlarged view showing a lower portion of a clamping member of the unit of FIG. 11.

The insertion head unit 308 may be constructed in such a manner as shown in FIGS. 10-12. An insertion head unit 308 shown in FIGS. 10-12 is adapted to handle an electronic component having leads such as a single-in-line package IC (SIP-IC) or the like. The insertion head unit 308 includes a vertical shaft 314 disposed to be movable in the vertical direction and a support block 316 fixedly mounted on a lower end of the vertical shaft 314. The support block 316 has a pair of clamping members 318 pivotably mounted thereon by means of support pins 320. The pivotal movement of each of the clamping members 318 is limited to a predetermined range by stoppers 322 and 324 threadedly inserted into the support block 316. Also, the pin stoppers 322 have compression springs 326 fitted thereon, respectively, which serve to constantly force the clamping members 318 in the direction of causing lower ends thereof to be separated from each other. Also, the support block 316 is provided with actuation air cylinders 328 corresponding to the members 318. The air cylinders 328 each have a cylinder rod 330 which is adapted to be abutted against an inner side of an upper end of the corresponding clamping member 318. This results in the lower ends of the clamping members being closed to each other to securely clamp leads 332 of an SIP-IC 334 when the air cylinders 328 each force the upper end of the member 318 in the direction indicated by an arrow G.

The clamping members 318, as shown in FIG. 12, are formed on inner facing surfaces 336 of the lower ends thereof opposite to each other with guide grooves 338 for positioning the leads 332 of the SIP-IC 334.

The support block 316 is provided therein with a push rod 340 which is vertically movable in a space defined between the clamping members 318. The push rod 340, as shown in FIG. 11, has a lower end portion formed to have a larger width corresponding to the length of the SIP-IC 334. The push rod 340 is vertically moved by means of an actuation mechanism (not shown) arranged in the vertical shaft 314.

As described above, the actuation of the air cylinders 328 closes the lower ends of the clamping members 318 to each other to clamp the leads 332 of the SIP-IC 334 therebetween. At this time, the leads 332 are engaged in the guide grooves 338 of the opposite surfaces 336 of the members 318. Then, the clamping members 318 are downwardly moved with the lowering of the vertical shaft 314, so that the leads 332 of the SIP-IC 334 start to be inserted into holes of a printed circuitboard 104, as indicated by dashed lines in the lower regions of FIGS. 10 and 11. Subsequently, the push rod 340 is lowered to press a body of the SIP-IC 334, thereby to further insert the leads 334 into the board 104. At this time, the clamping members 318 are returned to the original state or opened at the lower ends thereof. Then, the rod is further lowered to fully and securely insert the leads 332 in the printed circuitboard 104.

Figure 15:
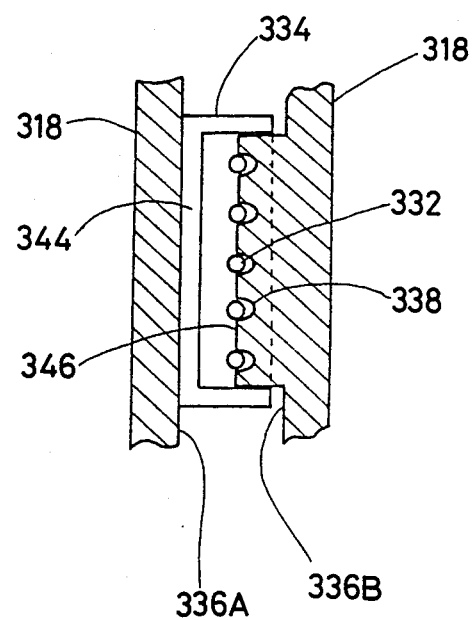
FIG. 15 is an enlarged view showing a lower portion of a clamping member in the insertion head units shown in FIG. 13.
Figure 17:
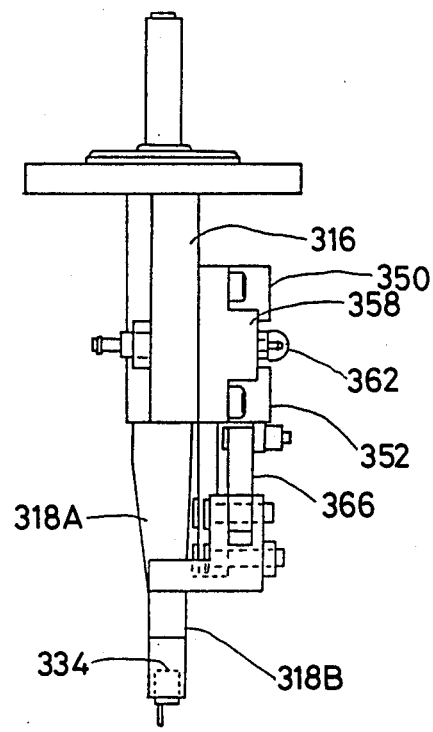
FIG. 17 is a side view of the insertion head unit shown in FIG. 16.

FIGS. 13 to 15 show a modification of the insertion head unit shown in FIGS. 10 to 12, and like reference numerals have been used to identify like parts. The modification is constructed to abut an inner surface of a lower end of one clamping member against a body of an electronic component, and to engage an inner surface of the other clamping member opposite to the surface of the one clamping member with leads of the component. Also, the insertion head unit is adapted to handle an electronic component having a plurality of leads or pins such as a pin connector and the like.

More particularly, one of clamping members 318 has an inner surface 336A formed into a flat shape sufficient to abut a side surface of a body 344 of an electronic component 334 such as a pin connector, and the other clamping member 318 has an inner surface 336B which faces opposite to the surface 336A and is formed to support upwardly projecting pins or leads 332 of the component 334. For this purpose, the inner surface 336B is provided with a projection 346 formed with guide grooves 338 for positioning the pins 332 therein. The push rod is formed on a lower end thereof with a recess 347 engaged with the pins 332 of the pin connector 334. The remaining parts of the insertion head unit 308 are constructed and function in substantially the same manner as that shown and described in connection with FIGS. 10 to 12.

Alternatively, the insertion head unit suitable for use in the present invention may be constructed in such a manner as shown in FIGS. 16 to 19, which is adapted to securely clamp a variety of different electronic components. Again, like parts have been identified with like reference numerals.

More particularly, an insertion head unit 308 includes a vertical shaft 314 and a support block 316 fixedly mounted on a lower end of the vertical shaft 314. The support block 316 has a push rod 340 provided therethrough. The support block also has a stationary clamping member 318A fixedly mounted on a lower end thereof by means of a mounting screw 348 in a manner such that it is readily shifted depending upon the dimensions of a particular electronic component 334.

Figure 18:
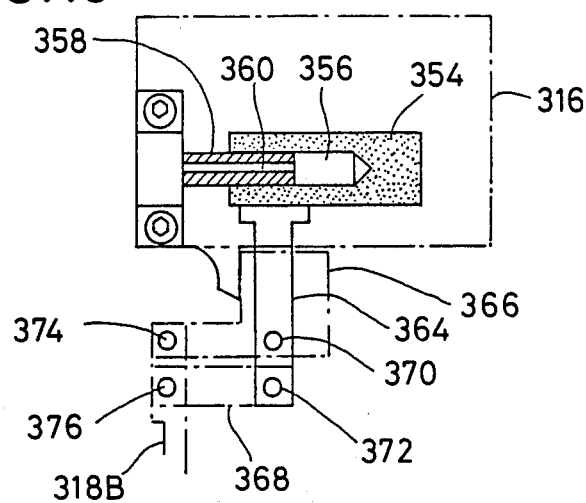
FIG. 18 is a front view in section showing the essential part of the insertion head unit of FIG. 16.

The support block 316 also has a pair of guide members 350 and 352 provided on an outside thereof spaced from each other at an interval, between which a slider 354 is interposed so as to be horizontally slidable. The slider 354, as shown in FIG. 18, is constructed to also act as an air cylinder. More particularly, the slider 354 has a cylindrical chamber 356 formed therein, and a piston 358 received in the chamber 356 is mounted in the support block 316. The piston 358 is formed therein with an air passage 360 for feeding air to the cylindrical chamber 356. Arranged between the piston 358 and the slider 354 is an extension spring 362 for returning the slider in the left direction.

The slider 354 is integrally formed with a downwardly extending member 364 on which parallel links 366 and 368 are pivotably mounted by means of pins 370 and 372. Pivotably connected or mounted on distal ends of the parallel links 366 and 368 by means of pins 374 and 376 is a movable clamping member 318B. Also, arranged between the link 366 and the pin 372 is an extension spring 378 for forcing the link 366 so that the distal end of the link 366 is lowered. The link 366 has rollers 380 and 382 pivotably mounted thereon, and a stopper 384 is fixedly mounted on the support frame 316.

Figure 19:
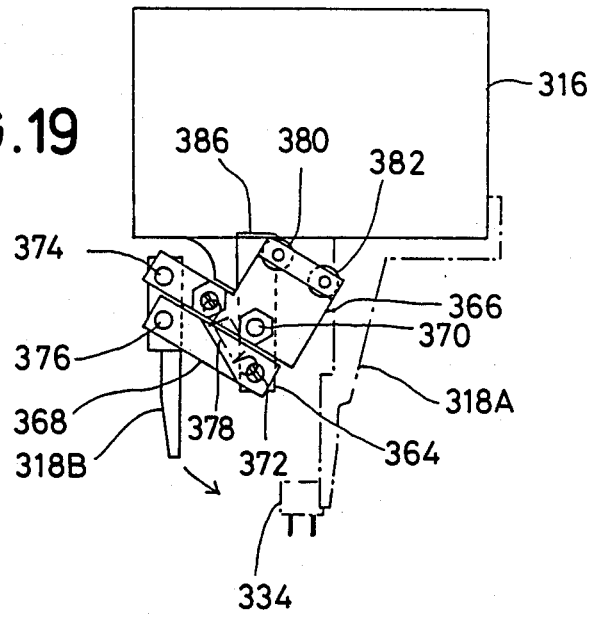
FIG. 19 is a front view showing the operation of a movable clamping member, of the unit of FIG. 16.

In the insertion head unit 308 shown in FIGS. 16 to 19, when the air cylinder in the slider 354 is not actuated, the slider is positioned at the left end by means of the extension spring 362, so that the stopper 384 abuts against the link 366 to rotate the link 336 in the clockwise direction as shown in FIG. 19.

In this state, the insertion head unit is moved to a position of receiving an electronic component from an electronic component feed mechanism and the inner surface 36 of one stationary clamping member 318A is positioned in close proximity and opposite to one end surface of an electronic component 334. Then, the air cylinder in the slider 354 is actuated to move the slider 354 in the right direction. This causes the distal ends of the parallel links 366 and 368 to be gradually lowered due to the force of the extension spring 378, so that the roller 382 may abut against the lower surface of the support block 316 at the time when the stopper 384 is released from the pivoting abutment against the link 366, as shown in FIGS. 16 and 19, resulting in the movable clamping member 318B being at the same level or height as the stationary clamping member 318A. The support block 316 is formed on the lower surface thereof with a groove 386, which serves to prevent the support block from hindering the movement of the roller 380.

Then, further movement of the slider 354 in the right direction causes the movable clamping member 318B to approach the stationary clamping member 318A while keeping parallel to the member 318A, so that an electronic component may be clamped therebetween. At this time, the opposite surfaces 336 of the clamping members 318 are kept parallel to each other, so that the opposite surfaces may be planely contacted with the electronic component and positively hold it therebetween irrespective of the dimensions thereof. The roller 380 not only effectively prevents the movable clamping member 318B from upwardly swinging due to the reaction of the clamping operation, but abuts against the lower surface of the support block 316 to prevent the return of the clamping member 318B.

Then, the insertion head unit 308 is moved to a position above a printed circuitboard 104 and lowered to the board to accomplish the insertion of the electronic component into the board. Thereafter, air is removed from the air cylinder in the slider 354 to return the slider to the left direction by means of the extension spring 362, so that the movable clamping member 318B may be returned to the raised position shown in FIG. 18.

The insertion head unit suitable for use in the inserting apparatus of the present invention may be constructed in such a manner as shown in FIGS. 20 to 24. An insertion head unit shown in FIGS. 20 to 24 is in the form of an insertion chuck unit which is adapted to attract electronic components of different forms of which at least a part is formed of a magnetic material using electromagnetic force.

An insertion chuck mechanism generally designated by reference numeral 500 includes an air cylinder 502 having a rod 504 and a chuck 506 connected to a lower end of the rod 504. The chuck 506 may comprise, for example, an electromagnet formed by winding a coil 508 around a cylinder 510 formed of a magnetic material.

Figure 20:
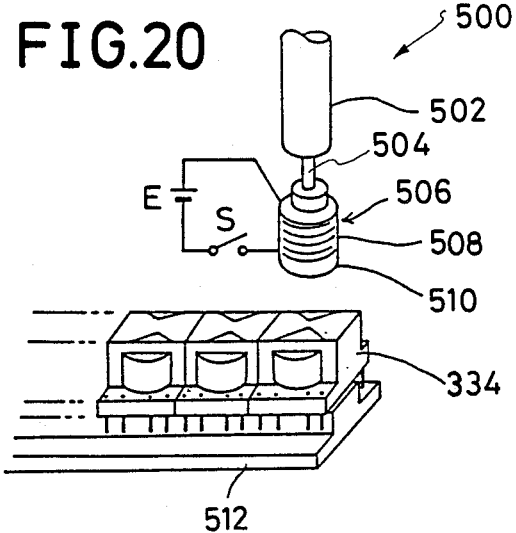
FIG. 20 is a perspective view showing an insertion chuck unit at one stage of its operation.
Figure 21:
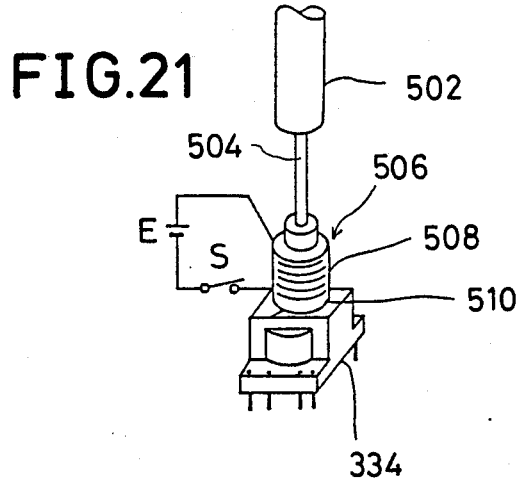
FIG. 21 is a perspective view of the insertion chuck unit of FIG. 20 at another stage of its operation.

Electronic components 334 to be held by the insertion chuck unit 500 are formed at least a part thereof of a magnetic material such as transformers, choke coils and the like, and are arranged on a feed tray or chute 512 as shown in FIG. 20. The electronic component has a flat upper surface and, correspondingly, the chuck 506 has a flat lower surface. Reference characters E and S designate a D.C. power source and a switch, respectively.

Now, the manner of operation of the insertion chuck mechanism constructed as described above will be described hereinafter.

Figure 22:
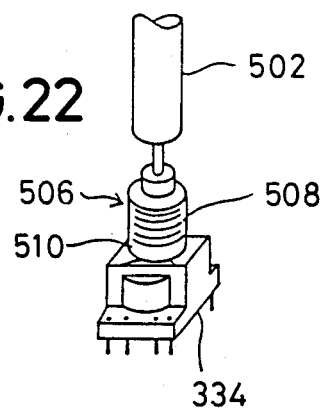
FIG. 22 is a perspective view of the insertion chuck unit of FIG. 20 at still another stage of its operation.
Figure 23:
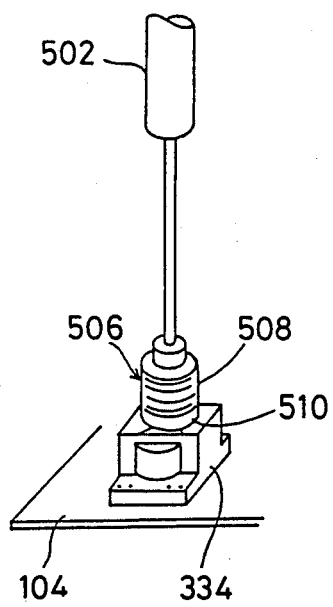
FIG. 23 is a perspective view of the insertion chuck unit of FIG. 20 at yet another stage of its operation.
Figure 24:
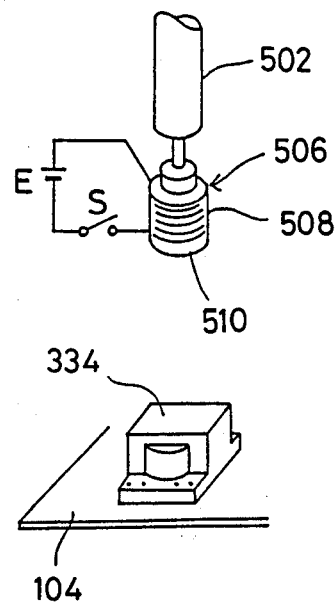
FIG. 24 is a perspective view of the insertion chuck unit of FIG. 20 at a still further stage of its operation.
Figure 25A:
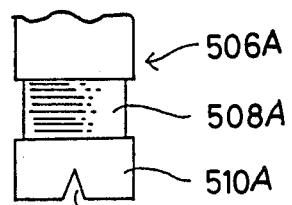
FIG. 25A is a front view showing another modification of an insertion chuck unit.
Figure 25B:
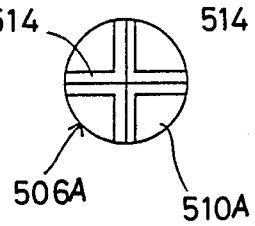
FIG. 25B is a bottom view of the insertion chuck unit shown in FIG. 25A.

First, the chuck 506 is moved to a position above a first electronic component 334 (see FIG. 20), and the air cylinder 502 is actuated to lower the chuck onto the component to closely contact the lower surface of the chuck 506 with the upper surface of the component. Then the switch S is closed to energize the coil 508 to cause the chuck to attract the component due to electromagnetic force (see FIG. 21). Then, the air cylinder 502 is actuated to vertically move the chuck 506 and lift the component as shown in FIG. 22. Subsequently, the chuck 506 is transferred to a position above a printed circuitboard 104, and the air cylinder 502 is actuated again to lower the chuck so that the component may be inserted into a predetermined position on the printed circuitboard 104 (see FIG. 23). Thereafter, the switch S is opened to deenergize the coil 508 to cause the chuck 506 to release the component 334 therefrom, and then the air cylinder is actuated to return the chuck to the raised position (see FIG. 24).

Figure 26:
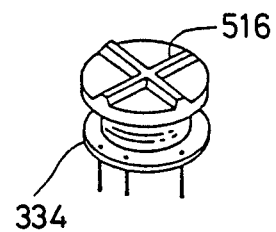
FIG. 26 is a perspective view showing an electronic component handled by the insertion chuck unit shown in FIG. 25.
Figure 27:
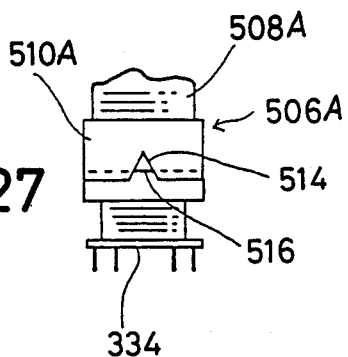
FIG. 27 is a front view showing the operation of the insertion chuck unit shown in FIG. 25.

The insertion chuck mechanism may be modified as shown in FIGS. 25A, 25B, 26 and 27. In the modification of FIGS. 25 to 27, a chuck 506A having a coil 508A and a cylinder 510A is formed on a lower end surface thereof with an aligning cross groove 514 (see FIG. 25B). Correspondingly, an electronic component 334, as shown in FIG. 26, is formed on an upper surface thereof with a cross projection 516 which is positionably received in the groove 514 during the electromagnetic attraction shown in FIG. 27.

FIGS. 28A, 28B, 29 and 30 show another modification of the insertion chuck unit. In this modification, a chuck 506B having a coil 508B and a cylinder 510B is formed on a lower end surface thereat with an automatically centering recess 518 and a turning direction aligning recess 520 (see FIG. 28B). Correspondingly, an electronic component 334 of different form, as shown in FIG. 29, containing a portion formed of a magnetic material such as a transformer, a choke coil and the like each are formed on an upper surface thereof with a centering projection 522 and a turning direction aligning projection 524. Thus, when an electronic component is electromagnetically attracted to the chuck 506B, the recesses 518 and 520 fittingly receive therein the projections 522 and 524, respectively, thereby automatically accomplishing the centering and aligning of the component 334 with respect to the chuck 506B, as shown in FIG. 30.

Figure 31:
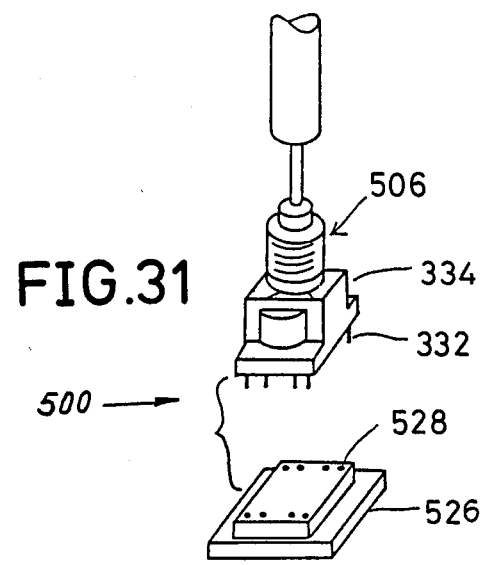
FIG. 31 is a perspective view showing the operation of an insertion chuck unit wherein a correction station is used.
Figure 32:
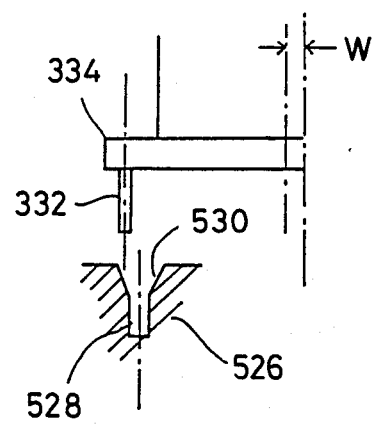
FIGS. 32 and 33 each is an enlarged view showing the correction using a correction station during operation.
Figure 33:
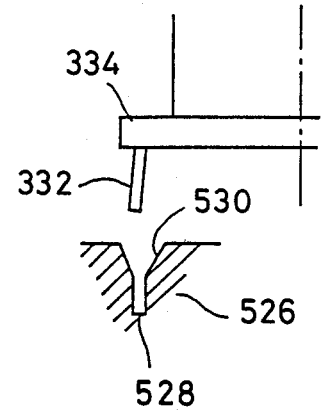

FIGS. 31 to 33 show a further modification of the insertion chuck unit. More particularly, an insertion chuck unit 500 shown in FIGS. 31 to 33 is provided with a correction station 526 for correcting the deflection of an electronic component 334 held on a chuck 506 with respect to the chuck prior to the insertion of the component into a printed circuitboard. The correction station 526, as shown in FIG. 32, has a plurality of correction holes 528 formed corresponding to leads 332 of the component 334. The correction holes 528 each have a tapered opening or entrance 530. Thus, the insertion of the leads 332 of the component 334 into the correction holes 528 causes the component 334 to be laterally slid with respect to the chuck 506, to eliminate the deflection W between the component and the chuck.

Figure 34:
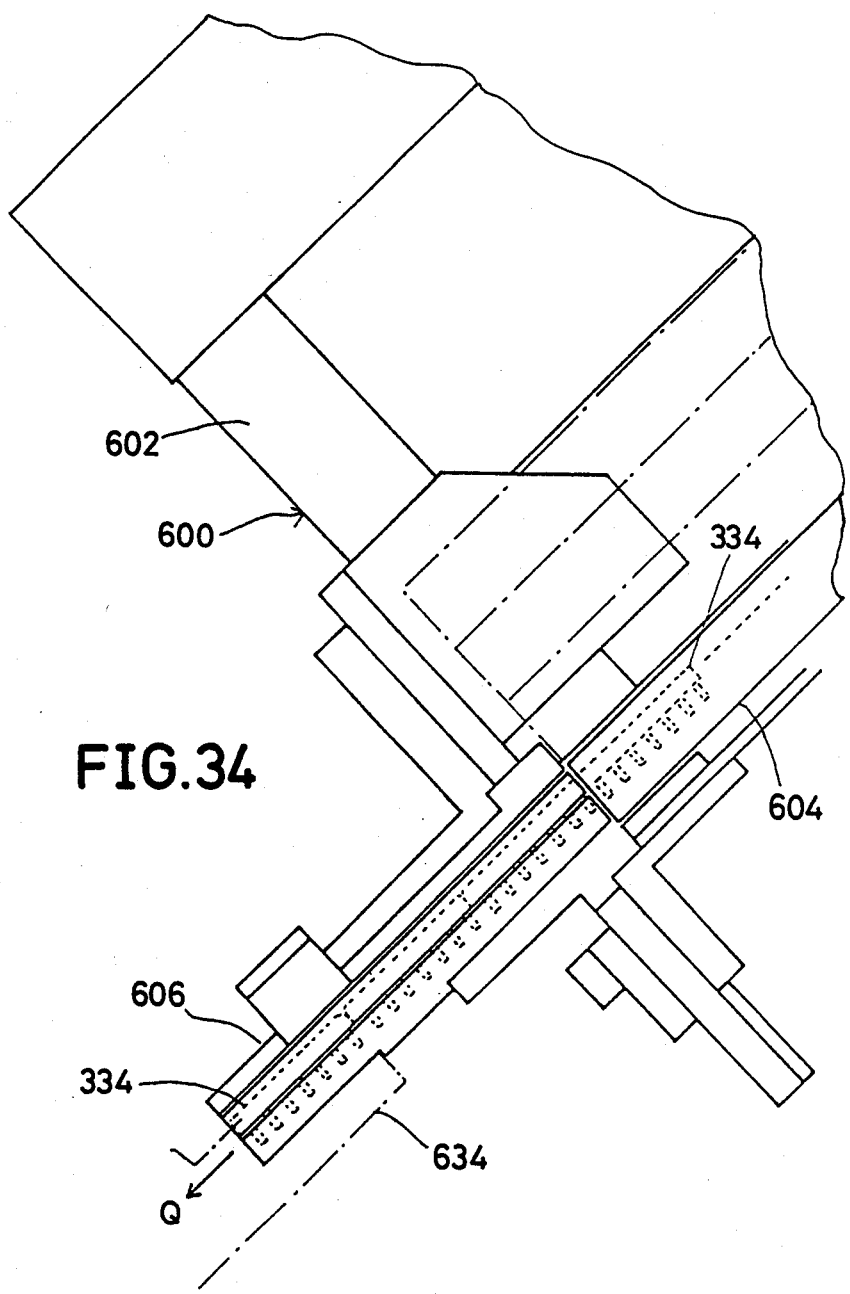
FIG. 34 is a side view showing an electronic component feed mechanism.
Figure 35:
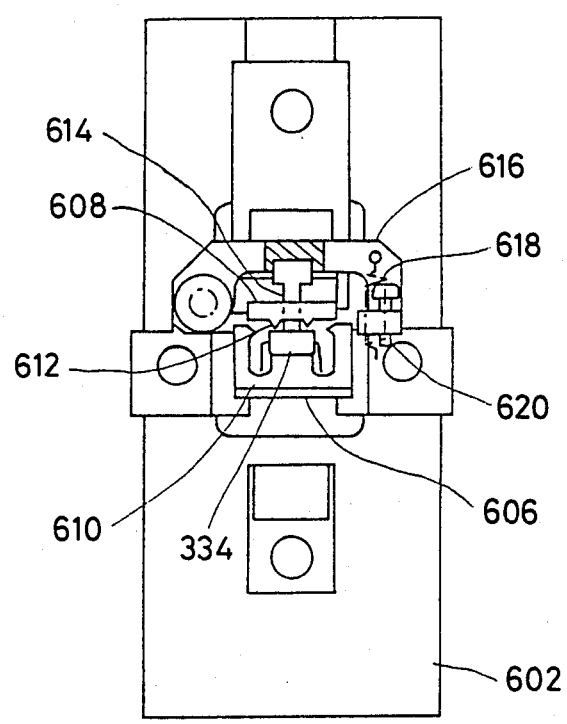
FIG. 35 is a front view showing an electronic component feed section of the mechanism of FIG. 34.

Electronic Component Feed Mechanism:

The electronic component feed mechanism may be constructed in such a manner as shown in FIGS. 34 and 35. A feed mechanism shown in FIGS. 34 and 35 is adapted to separately feed electronic components, particularly dual-in-line type ICs received in magazines one by one. More specifically, the feed mechanism 600 includes a frame 602 in which a plurality of magazines 604 each having electronic components or dual-in-line type ICs 334 therein are received in a manner to be superposed on one another. The magazines each are obliquely disposed at an angle of about 45 degrees with respect to the horizontal plane. The magazine is formed of a plastic material or the like into a cylindrical shape and receives electronic components superposed together in a predetermined manner in the longitudinal direction.

The feed mechanism 600 is provided at a lower portion thereof with an electronic component feed section 606 which is constructed to separately feed out electronic components one by one. In the feed section 606, as shown in FIG. 35, an upper guide member 608 and a lower guide member 610 constitute together and bound an electronic component passage which is in communication with the magazines 604. The upper guide member 608 is provided with at least one projection 612 which serves to decrease frictional resistance with an electronic component. In the feed station 606, the lowermost one of the electronic components received in the magazine is clamped by means of a clamper 614 fixed at an intermediate portion of a lever 616 pivotably mounted on the frame 602. As the clamper 614, such an insertion chuck unit, as shown in FIGS. 19 to 32, may be conveniently used. The clamper 614 is constantly urged to forcedly contact the electronic component by means of an extension spring 618. The lever 616 has a bolt 620 threadedly mounted on a distal end thereof. When the bolt is lifted, a lower end of the clamper 614 is also lifted to release the clamping of the electronic component.

The manner of operation of the feed mechanism constructed as described above will be described hereinafter.

First, a pre-selected pallet which is constructed as described hereinafter is moved to the feed mechanism 600 and pushes up the bolt 620 mounted on the distal end of the lever 616 to release an electronic component from the clamper 614, so that it may be fed out by gravity from the feed mechanism.

Figure 36:
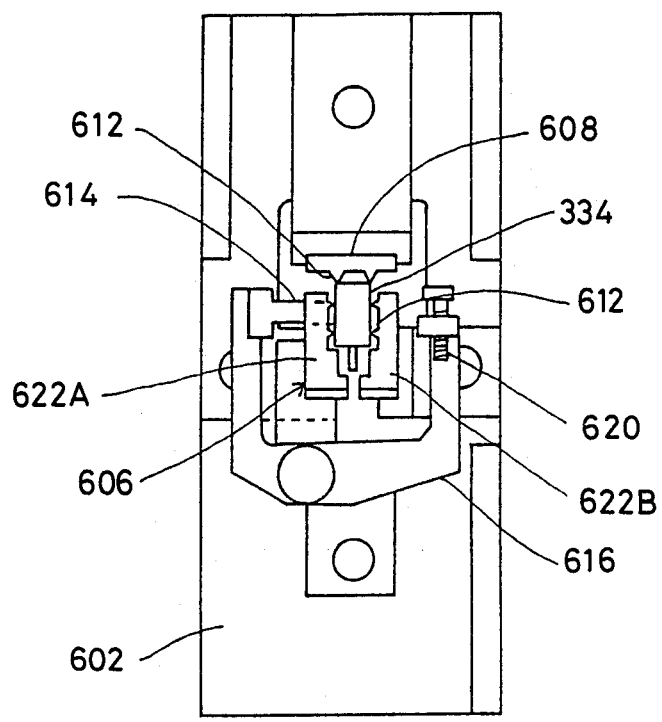
FIGS. 36 to 38 each is a front view showing different modifications of an electronic component feed section.

The electronic component feed mechanism 600 may be modified in such a manner as shown in FIG. 36, and like parts have been identified with like reference numerals. The modification of FIG. 36 is adapted to handle IFTs (intermediate frequency transistors). For this purpose, a feed section 606 is constructed to separately feed out the IFTs one by one therefrom. In the feed section 606, an upper guide member 608 fixed at a front portion of a frame 602 and a pair of side guide members 622A and 622B form together and bound an electronic component passage which is inclined at an angle of about 45 degrees with respect to the horizontal plane and which is in communication with the magazines 604. The guide members each are provided on an inner surface thereof with at least one projection 612 which serves to decrease frictional resistance with an electronic component.

In the feed section 606, the lowermost one of the electronic components or IFTs received in the magazine is clamped by means of a clamper 614 fixed at a distal end of a lever 616 pivotably mounted on the frame 602. The clamper 614 is constantly urged to forcedly contact a side portion of the electronic component by means of a spring means (not shown). The lever 616 has a bolt 620 threadedly mounted on the other end thereof. When the bolt is lifted, a lower end of the clamper 614 is also lifted to release the electronic component held by the clamper 614 therefrom. The remaining part of the feed mechanism of FIG. 36 is constructed in substantially the same manner as that shown in FIGS. 34 and 35.

Figure 37:
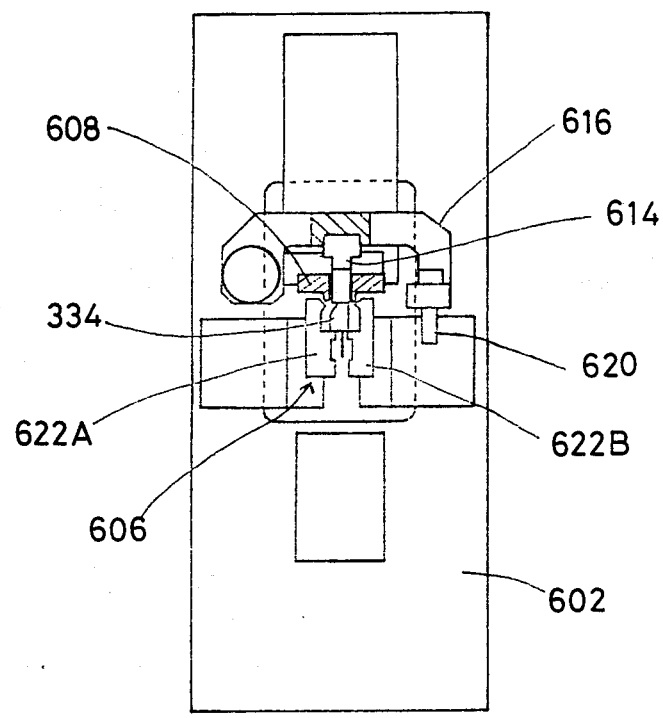

FIG. 37 shows another modification of the electronic component feed mechanism, which is adapted to handle SIP-ICs 334, and like reference numerals have been used to identify like parts. A feed section 606 is constructed to separately feed out the SIP-ICs one by one therefrom. In the feed section 606, an upper guide member 608 fixed at a front portion of a frame 602 and a pair of side guide members 622A and 622B form together and bound an electronic component passage which is inclined at an angle of about 45 degrees with respect to the horizontal plane and which is in communication with the magazines 604. In the feed section 606, the lowermost one of electronic components or SIP-ICs 334 received in the magazine is clamped by means of a clamper 614 fixed at an intermediate portion of a lever 616 pivotably mounted on the frame 602. The clamper 614 is constantly urged to forcedly contact the electronic component by means of a spring means (not shown). The lever 616 has a bolt 620 threadedly mounted on a distal end thereof. When the bolt is lifted at a lower end thereof, a lower end of the clamper 614 is also lifted to release the electronic component held by the clamper 614 therefrom. The remaining part of the feed mechanism of FIG. 37 is constructed in substantially the same manner as that shown in FIGS. 34 and 35.

Figure 38:
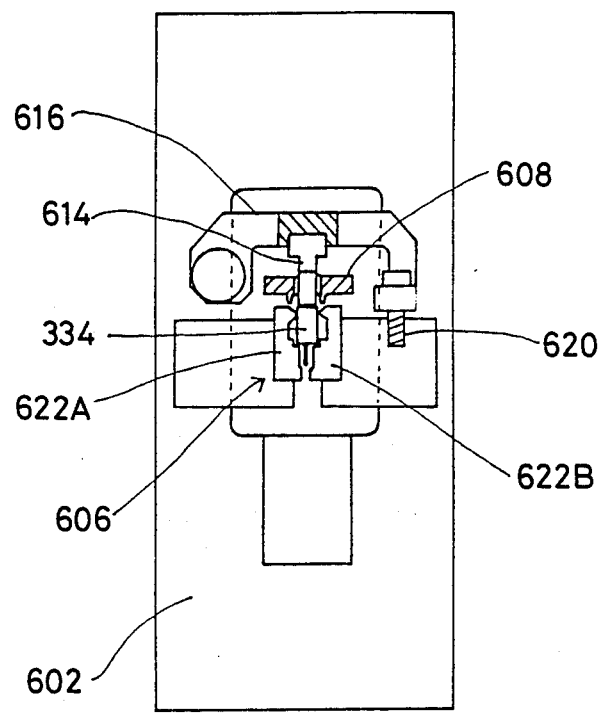

A further modification of the electronic component feed mechanism is shown in FIG. 38, which is adapted to handle pin connectors 334 and, again, like reference numerals have been used to identify like parts. A feed section 606 is constructed to separately feed out pin connectors one by one therefrom. In the feed section 606, an upper guide member 608 fixed at a front portion of a frame 602 and a pair of side guide members 622A and 622B form together and bound an electronic component passage which is inclined at an angle of about 45 degrees with respect to the horizontal plane and which is in communication with the magazines 604. In the feed station 606, the lowermost one of the electronic components or pin connectors received in the magazine is clamped by means of a clamper 614 fixed at an intermediate portion of a lever 616 pivotably mounted on the frame 602. The clamper 614 is constantly urged to forcedly contact with the electronic component by means of a spring means (not shown). The lever 616 has a bolt 620 threadedly mounted on a distal end thereof. When the bolt is lifted at a lower end thereof, a lower end of the clamper 614 is also lifted to release the electronic component held by the clamper 614 therefrom. The remaining part of the feed mechanism of FIG. 38 is constructed in substantially the same manner as that shown in FIGS. 34 and 35.

Figure 39:
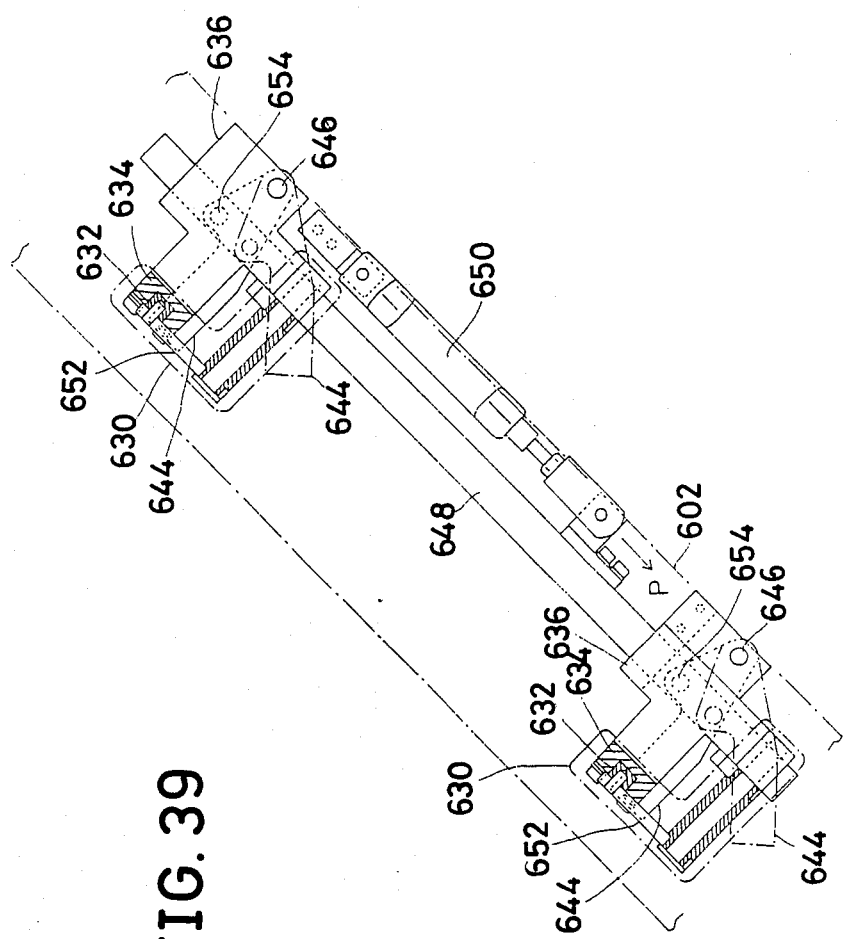
FIG. 39 is a side view showing a magazine discharge mechanism.
Figure 40:
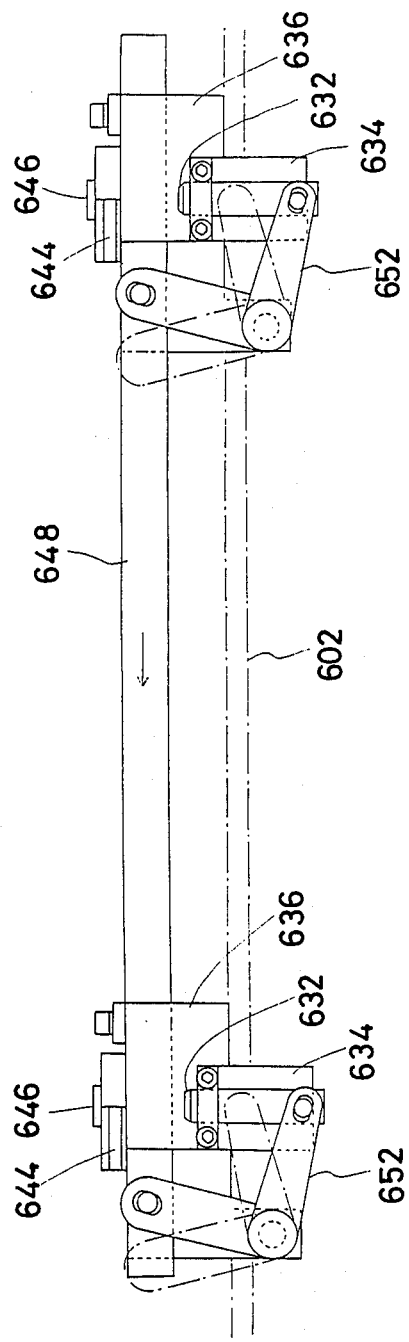
FIG. 40 is a plan view of the magazine discharge mechanism shown in FIG. 39.
Figure 41:
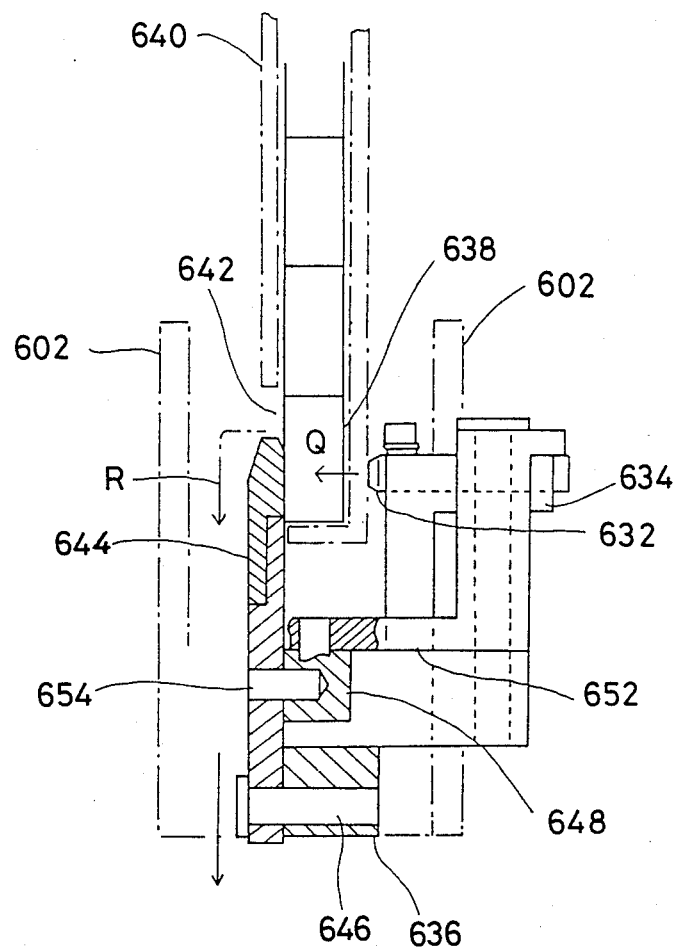
FIG. 41 is a front view in section of the magazine discharge mechanism shown in FIG. 39.
Figure 42:
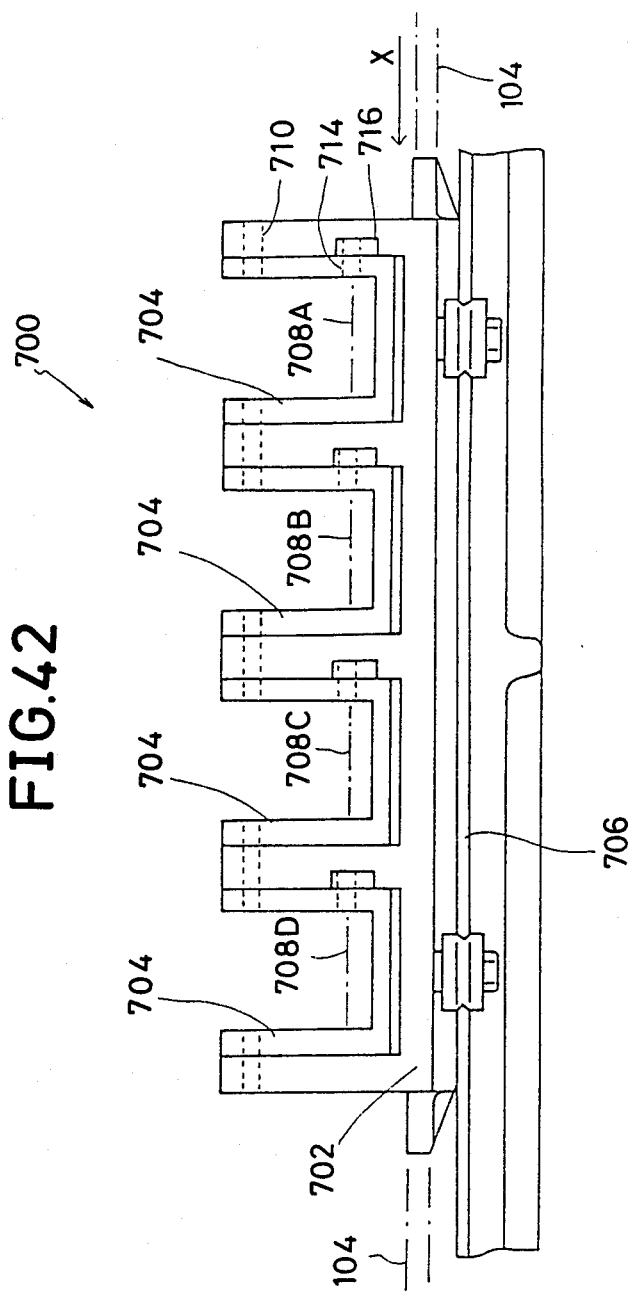
FIG. 42 is a front view showing a pallet mechanism.
Figure 43:
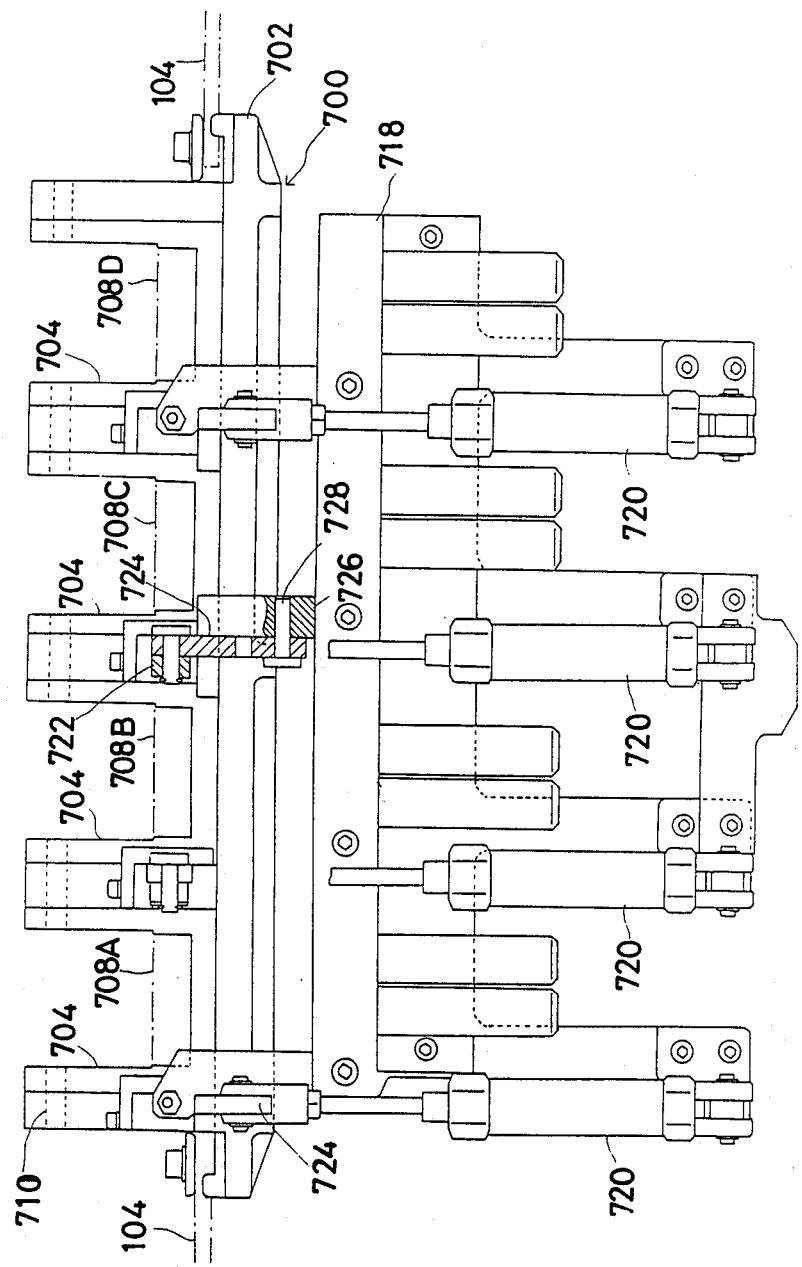
FIG. 43 is a rear view of the pallet mechanism shown in FIG. 42.
Figure 44:
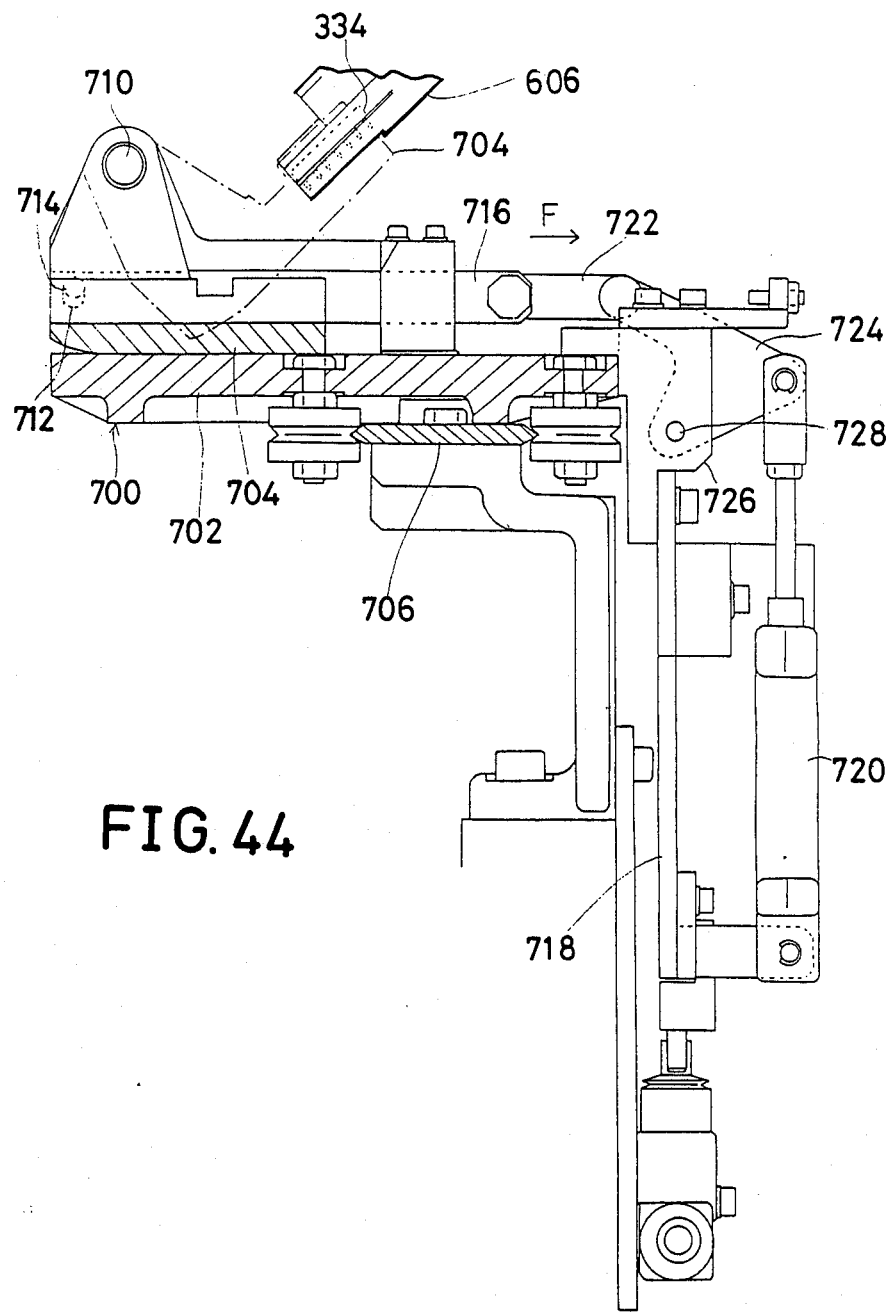
FIG. 44 is a side view in section of the pallet mechanism shown in FIG. 42.

A magazine discharge mechanism in the electronic component feed mechanism may be constructed as shown in FIGS. 39 to 41, which is adapted to rapidly replace an empty magazine from which electronic components are discharged with a full magazine charged with components.

The magazine discharge mechanism shown in FIGS. 39 to 41 includes a window 630 formed on one side surface of a frame 602 arranged in a manner to be inclined at an angle of about 45 degrees with respect to the horizontal plane, and a discharge pin 632 slidably supported on a slide guide 634 so as to be projectable through the window 630 into the frame 602. The slide guide 634 is formed integrally with a support member 636 fixed on the frame 602.

As shown in FIG. 41, the discharge pin 632 has a distal end opposed to one side of the lowermost one of cylindrical magazines 638 received in a magazine holder 640 arranged in the frame 602. The magazine holder 640 is provided at a lower portion thereof opposite to the other side of the magazine 638 with a discharge gap 642 of a size sufficient to allow the magazine to pass therethrough. The support member 636 has a holding claw member 644 rotatably mounted thereon by means of a pin 646, which acts to hold a side surface of a magazine 638 exposed from the gap 642. Slidably supported on the support member 636 is a connection bar 648, which is adapted to be actuated by an air cylinder 650 provided on the frame 602. The connection bar 648 is connected with the discharge pin 632 through a bell crank 652 pivotably supported on the support member 636, and the holding claw member 644 is pivotably mounted on the connection bar 648 by means of a pin 654.

In the electronic component feed mechanism 600 constructed as described above, when the air cylinder 650 is retracted as shown in FIG. 39, the discharge pin 632 is also retracted as shown in FIG. 40, and the holding claw member 644 rises to hold one side of the lowermost magazine 638. When electronic components are discharged from the lowermost magazine to render it empty, the air cylinder 650 extends as indicated by an arrow P in FIG. 39, and therefore the connection bar 648 is moved in the same direction. This causes the holding member 644 to be inclined as indicated by the dash-dot at 644 lines in FIG. 39 and to be released from the lowermost magazine 638. Also, this causes the bell crank 652 to be rotated, resulting in the discharge pin 632 being projected as indicated by an arrow Q in FIG. 41 to push out the empty magazine through the gap 642 of the magazine holder 640. Then, the discharged magazine 638 falls down through a space between the magazine holder 640 and the frame 602 as indicated by an arrow R in FIG. 41. After the discharge pin 632 and holding claw member 644 are then returned to the original position, the subsequent full magazine is at the lowermost position.

Pallet Mechanism:

The pallet mechanism 700 is adapted to receive an electronic component from the feed mechanism 600 and transfer it to the inserting mechanism 300 without using specific transferring means. Also, the pallet mechanism is constructed to be connected to the above-described timing belt 224 and horizontally movable along the up-down conveyor belts 202 and 204 and X-table 102 in the X-direction. The electronic component feed section 606 of the feed mechanism 600 is arranged in alignment with the passage of movement of the pallet mechanism.

The pallet mechanism may be constructed in such a manner as shown in FIGS. 42 to 46. A pallet mechanism 700 of FIGS. 42 to 46 includes a pallet body 702 and four tilting members 704 of a U-shape in section, each pivotably supported on the pallet body 702 at fixed intervals. The pallet body 702 is adapted to be slidable on a rail 706 arranged in the X-direction. The tilting members 704 have carrier members 708A-708D fixedly mounted on bottom surfaces thereof, respectively. The carrier members 708A-708D are adapted to carry electronic components different in shape from one another thereon. For example, the carrier members 708A-708D may carry a dual-in-line type IC, an SIP-IC, an IFT and a pin connector thereon, respectively.

The tilting members 704 each are pivotably mounted on the pallet body 702 by means of a pin 710 and provided with a hole 712 which is engaged with a pin 714 of a slider 716 slidable on the pallet body 702. The pallt body 702 has a support plate 718 integrally thereon to downwardly extend therefrom, and on the support plate 718 are arranged double air cylinders 720 corresponding to the four tilting members 704. The slider 716 is connected through a link 722 and a lever 724 to the piston of the air cylinder 20. The lever 724 is pivotably mounted on a fitment 726 fixed on the pallet body 702 by means of a pin 728. Accordingly, when the slider 716 is moved in the direction indicated by an arrow F in FIG. 44 due to the actuation of the air cylinders 720, the tilting members 704 each are inclined at an angle of about 45 degrees with respect to the horizontal plane, resulting in being ready for being connected to the feed section 606 of the feed mechanism 600 described above. The tilting members are returned to the horizontal position due to the return actuation of the air cylinders 720.

Figure 45:
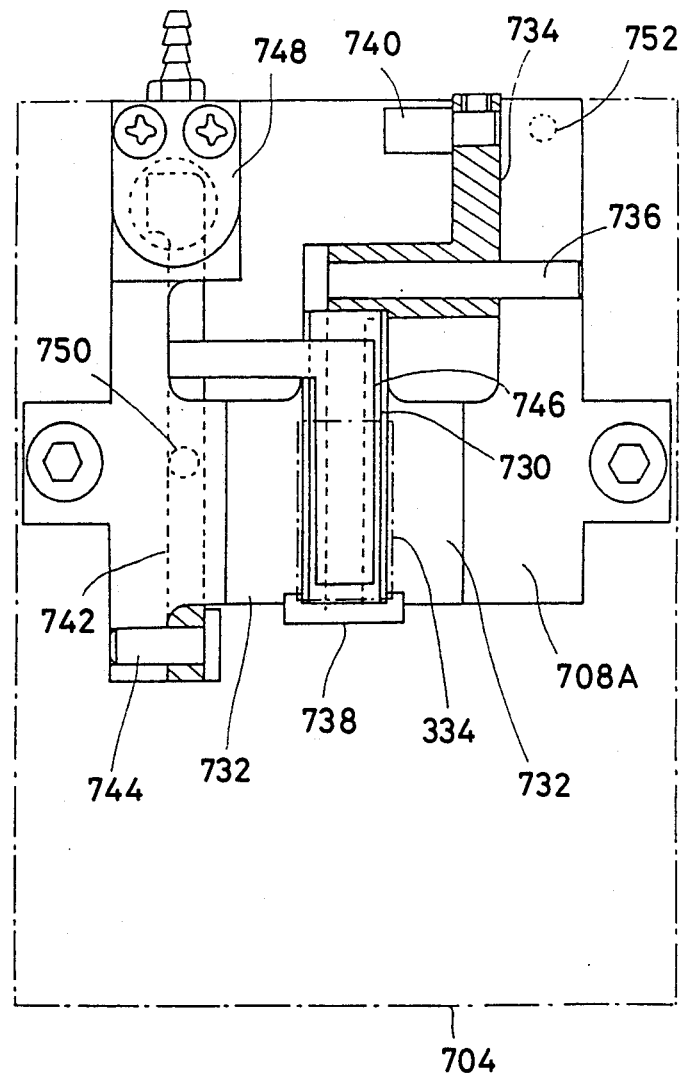
FIG. 45 is a plan view showing a carrier member.
Figure 46:
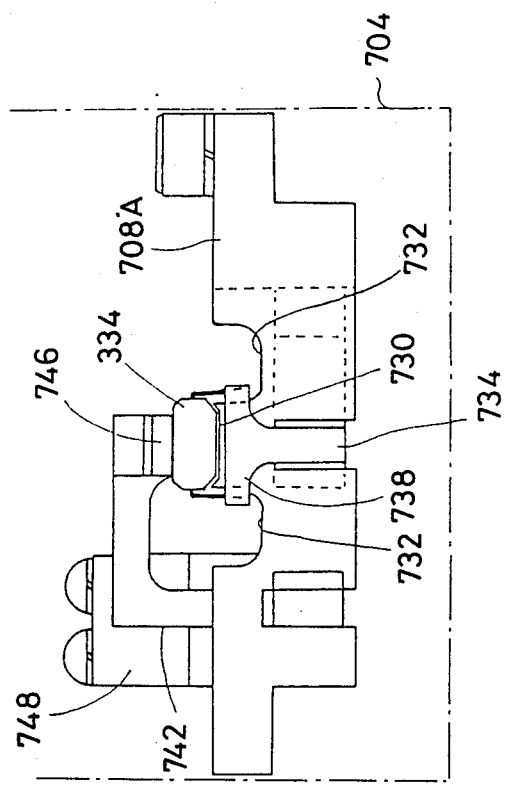
FIG. 46 is a front view of the carrier member shown in FIG. 45.

FIGS. 45 and 46 show a representative carrier member 708A which is adapted to carry a dual-in-line type IC 334 thereon. The carrier member 708A includes a supporter 730 on which the electronic component 334 is put. The supporter 730 is formed on both sides thereof with recesses 732 having a depth sufficient to receive leads of the component therein. Also, the carrier member 708A has a lever 734 pivotably supported thereon by means of a pin 736, so that a distal end of the lever may serve as a positioning stopper 738. A spring (not shown) constantly urges the positioning stopper 738 so that it may be at a lowered position at which the stopper is not actuated. Whereas, when the tilting member 704 is inclined, so that it may be ready to be connected to the feed station 606 to cause a pin 740 to be pushed down due to the abutment against a lower surface of the feed section 606; the positioning stopper 738 is raised to a positioning level to regulate the leads of the component 334.

Also, the carrier member 708A has a clamp arm 742 pivotably mounted thereon by means of a pin 744, and a clamper 746 is provided to extend from the clamp arm 742 to a position above the supporter 730. The clamper 746 is adapted to clamp the electronic component 334 when an air cylinder 748 pushes down the distal end of the clamp arm 742. The clamp arm 742 is constantly urged in the direction of releasing the clamping by means of a spring 750.

A point 752 on the carrier member 708A is adapted to abut against the clamping means of the feed section 606 to release the clamping action to cause the electronic component to fall down and be positioned on the supporter 730.

Figure 47:
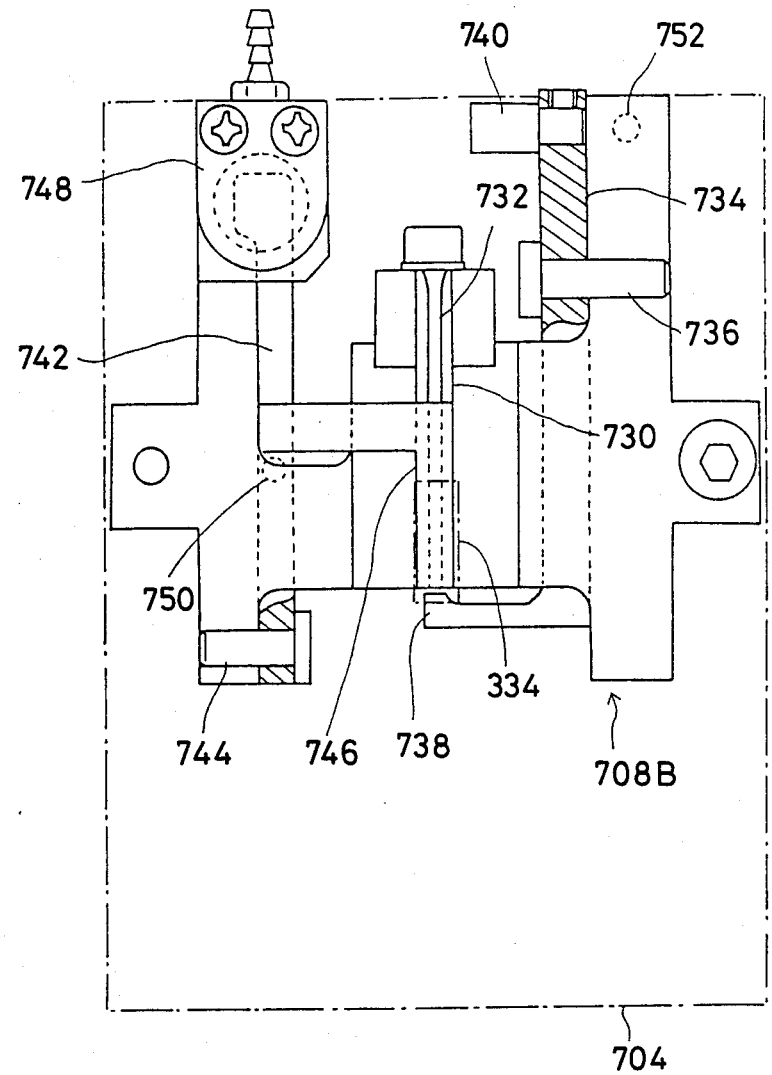
FIGS. 47 to 49 each is a plan view showing different modifications of a carrier member.
Figure 48:
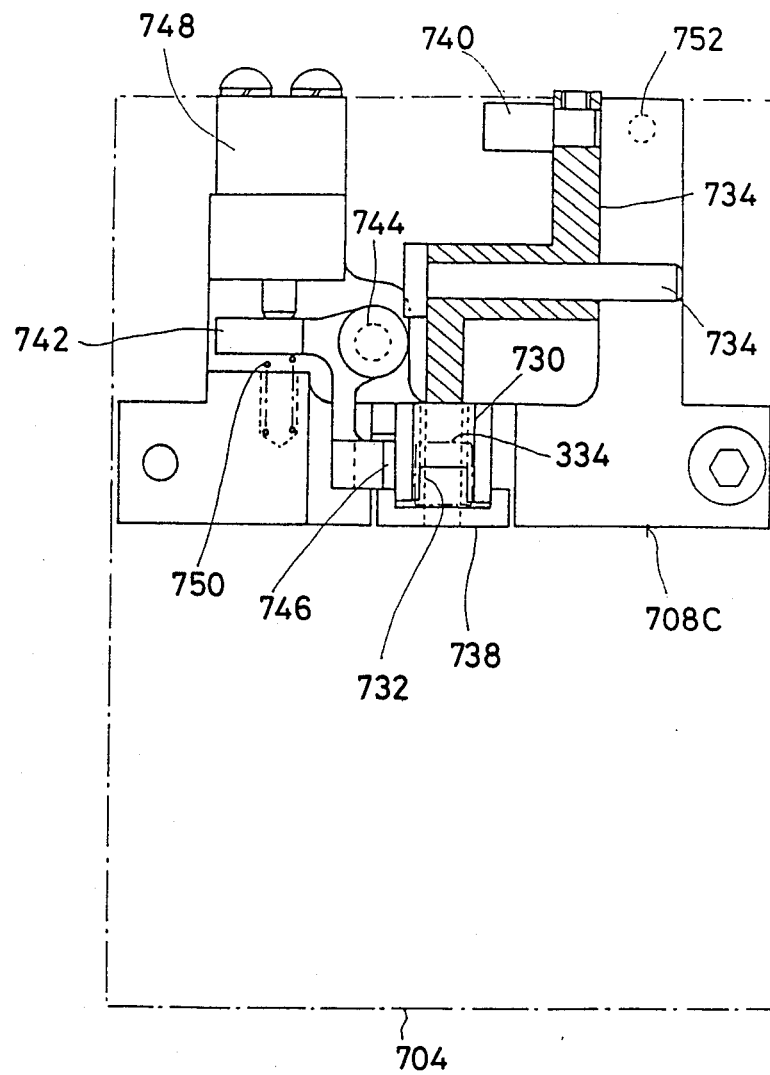
Figure 49:
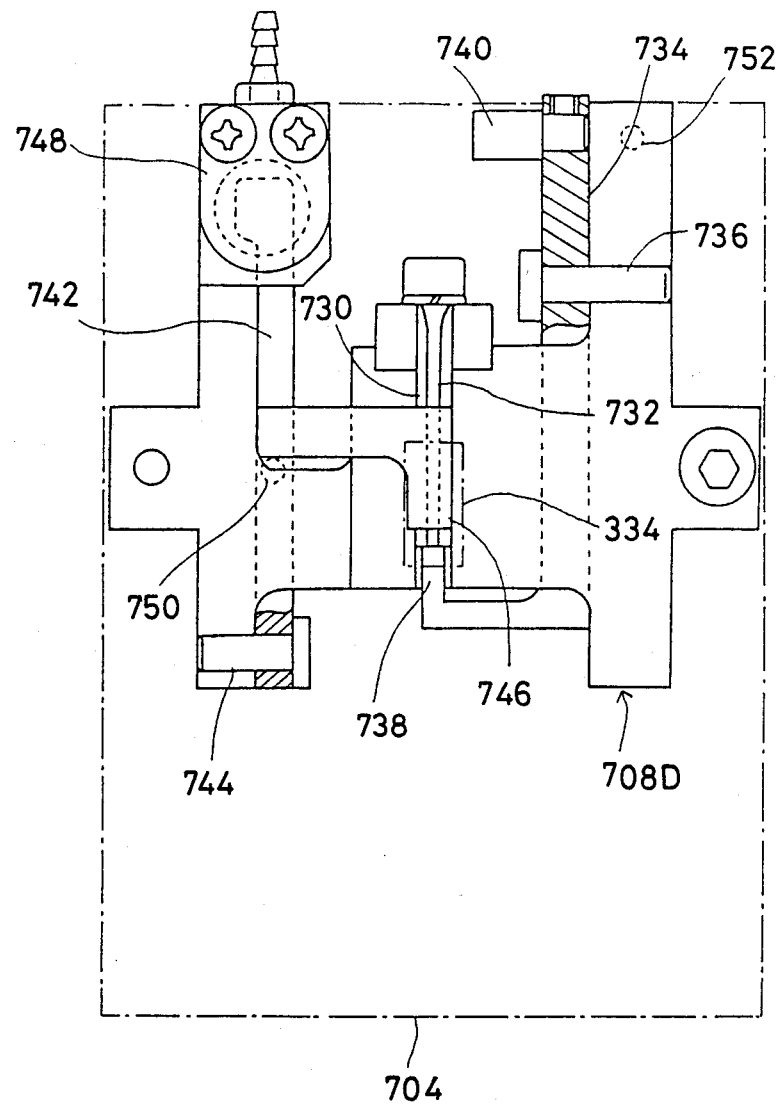

FIGS. 47 to 49 show carrier members 708B to 708D which are adapted to handle an SIP-IC, an IFT and a pin connector, respectively. The carrier members 708B to 708D each are constructed in substantially the same manner as the above-described carrier 708A, with like reference numerals identifying like parts, except that recesses 732 for receiving the leads of the component therein are formed at a central position thereof.

Now, the manner of operation of the pallet mechanism described above will be described hereinafter.

The carrier members 708A-708D on which a dual-in-line IC, an SIP-IC, an IFC and a pin connector are to be carried thereon, respectively, are first moved to corresponding feed sections 606 of an electronic component feed mechanism 600. Then, the air cylinders 720 are actuated to move the sliders 716 in the direction indicated by arrow F in FIG. 44. This causes the tilting members 704 to be inclined at an angle of 45 degrees as indicated by dashed lines in FIG. 44, so that the carrier members 708A-708D may be aligned and connected with the corresponding feed sections 606. This results in the pin 740 of each of the carrier members 708A-708D being pushed down due to the abutment against the lower surface of the feed section 606, so that the positioning stopper 738 may be at the positioning position shown in FIG. 46. Then, the point 752 on each of the carrier members 708A-708D releases the clamping of each electronic component by the respective feed section 606 to cause the lowermost one of the components to be moved to the supporter 730 by gravity. Subsequently, the air cylinder 748 is actuated to push down the clamp arm 742, so that the clamper 746 may be lowered to clamp the component positioned on the supporter 730.

Then, the carrier members 708A-708D each are returned to the original horizontal position, and the subsequent electronic component is clamped at each of the feed sections 606. When the carrier members are returned to the original position, the pallet mechanism is moved to a position along the X-direction of the inserting mechanism 300 because the mechanism 300 does not carry out the X-direction movement. This results in the X-direction position of the mechanism 300 being aligned with that of each of the carrier members.

When the pallet is stopped at the predetermined position as described above, the clamping of the component by each of the carrier members 708A-708D is released; and then the inserting mechanism 300 is moved in the Y-direction to cause the corresponding insertion head unit 308 to clamp the component and carry out the operation of inserting the component into a printed circuitboard as described above.

It will be understood that each of the elements described above, or two or more together, also may find a useful application in other types of constructions differing from the types described above.

While the invention has been illustrated and described as embodied in an apparatus for automatically inserting electronic components into printed circuitboards, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. An apparatus for automatically inserting electronic components into printed circuitboards conveyed along a travel path, comprising:
   a feed mechanism for feeding electronic components in an inclined manner relative to the travel path;
   a pallet mechanism having at least one carrier inclinably arranged to receive thereon the electronic components in an inclined manner from said feed mechanism; and
   an inserting mechanism for transferring the electronic components received from said pallet mechanism to a position above a respective printed circuitboard, and for inserting the electronic components into said respective printed circuitboard, said inserting mechanism including at least one insertion head unit for holding one of the electronic components thereon.

2. An apparatus as defined in claim 1, wherein said inserting mechanism includes a plurality of insertion head units, and said pallet mechanism includes a plurality of carriers corresponding to the number of said insertion head units.

3. An apparatus as defined in claim 1, wherein said printed circuitboards are arranged on a table which is movable only in an X-direction, and said inserting mechanism is movable in a Y-direction substantially perpendicular to the X-direction.

4. The apparatus of claim 3, wherein said at least one insertion head is additionally reciprocable in a substantially vertical direction.

5. An apparatus as defined in claim 1, wherein said pallet mechanism is movable in an X-direction, and said feed mechanism includes at least one feed section arranged along a passage of movement of said pallet mechanism.

6. An apparatus as defined in claim 1; and further comprising a mechanism for successively feeding printed circuitboards which includes a frame having vertical sections having inner surfaces facing opposite to each other; a pair of conveyor belts arranged on the inner surfaces of said vertical sections of said frame, said conveyor belts supporting both sides of each printed circuitboard; means for vertically moving said frame between a lowered and a raised position; a shaft arranged to be slidable along one of said vertical sections along the travel path of said printed circuitboards; claw means provided on said shaft; gear means for rotating said shaft to engage said claw means with each printed circuitboard when said frame is at its lowered position; and means for forwardly moving said shaft.

7. An apparatus as defined in claim 1, wherein said one insertion head unit includes a support block; a pair of clamping members pivotably mounted on said support block and having lower ends movable between a closed and an open position, said lower ends having inner surfaces facing oppositely to each other and being respectively provided with guide grooves, said guide grooves cooperating together to position and securely interpose leads of said one electronic component in the closed position; cylinder means for moving the lower ends of said clamping members between the closed and the open positions; and a push rod arranged in a manner to be vertically movable in a space between said clamping members.

8. An apparatus as defined in claim 1, wherein said one insertion head unit includes a support block; a pair of clamping members pivotably mounted on said support block and having lower ends movable between a closed and an open position, said lower ends having inner surfaces facing oppositely to each other, one of said inner surfaces being substantially flat so that it may be abutted against a side surface of a body of said one electronic component, and the other of said inner surfaces having a projection formed with guide grooves for positioning leads of said one electronic component; cylinder means for moving the lower ends of said clamping members between the closed and the open positions; and a push rod arranged in a manner to be vertically movable in a space between said clamping members.

9. An apparatus as defined in claim 1, wherein said one insertion head unit includes a support block; a stationary clamping member fixedly mounted on said support block; a slider slidably arranged on said support block, said slider having an extension; and a movable clamping member pivotably mounted on said extension of said slider, and connected to parallel links for movement between a raised position and a lowered position wherein the clamping members are respectively spaced further apart and closer to each other.

10. An apparatus as defined in claim 1, wherein said one insertion head unit includes a chuck having a lower surface contactable with said one electronic component, said chuck having an electromagnet body formed of a magnetic material and a coil wound on said body; and means for vertically moving said chuck.

11. The apparatus of claim 10, additionally comprising a correction station for correcting deflection of an electronic component retained on said chuck, prior to insertion of the same onto the printed circuit board, said correction station comprising a plurality of correction holes having tapered entrances, for receiving respective leads of the component.

12. An apparatus as defined in claim 10, wherein said lower surface of said chuck has a shape corresponding to that of an upper surface of said one electronic component contacting therewith.

13. The apparatus of claim 12, wherein said electromagnet body is formed with an aligning cross groove on said lower end surface thereof, for receiving a cross projection on a respective electronc component.

14. The apparatus of claim 12, wherein said electromagnet body is formed with a centering recess and a separate aligning recess on said lower end surface for receiving a centering projection and a separate aligning projection on a respective electronic component.

15. An apparatus as defined in claim 1, wherein said feed mechanism includes a frame for supporting magazines each receiving electronic components therein; and at least one feed section including guide members forming and bounding together an electronic component passage in communication with said magazines; said one feed section being provided with means for clamping an electronic component placed in said passage.

16. An apparatus as defined in claim 15, wherein said magazines and passage are arranged in a manner to be inclined at an angle of 45 degrees with respect to a horizontal plane.

17. An apparatus as defined in claim 1, wherein said feed mechanism includes a plurality of cylindrical magazines each having superposed electronic components received therein, said feed mechanism including a magazine discharge mechanism which has a holding member for holding the lowermost one of said magazines; a discharge pin located opposite to said lowermost magazine; and link means for projecting said discharge pin toward said lowermost magazine when said holding member is released from said lowermost magazine.

18. An apparatus as defined in claim 1, wherein said pallet mechanism includes a pallet body; at least one tilting member pivotably supported on said pallet body; a carrier member provided on said tilting member; and means for rotating said tilting member.

19. An apparatus as defined in claim 18, wherein said tilting member rotating means comprises drive means, said carrier member being inclined at an angle of about 45 degrees with respect to a horizontal plane due to the rotation of said tilting member.

20. An apparatus as defined in claim 18, wherein a plurality of said tilting members are provided at fixed intervals, said carrier member being provided for each of said tilting members.

21. An apparatus as defined in claim 1, wherein said pallet mechanism includes a pallet body; at least one tilting member pivotably supported on said pallet body; and a carrier member provided on said tilting member, said carrier member including a supporter on which said one electronic component is positioned, a positioning member for positioning said one electronic component on said supporter, and a clamper for clamping said one electronic component.

22. An apparatus as defined in claim 21, wherein said supporter is formed at a central portion thereof with at least one recess for receiving leads of said one electronic component therein.

23. An apparatus as defined in claim 21, wherein said supporter is formed on both sides thereof with recesses for receiving leads of said one electronic component therein.

24. An apparatus for automatically inserting electronic components of different forms into printed circuitboards successively conveyed along a travel path along which a plurality of workstations are arranged, comprising:

means for separately and simultaneously feeding different sets of electronic components in an inclined manner to pallet workstations, electronic components in each set having the same form;

pallet means at the pallet workstations for separately and simultaneously receiving the different sets of electronic components in an inclined manner, and for separately and simultaneously conveying the different sets of electronic components to insertion workstations; and inserting means at the insertion workstations for separately and simultaneously transferring the different sets of electronic components to positions above successive printed circuitboards and inserting the different sets of electronic components at the insertion workstations into the successive printed circuit boards, each board in its turn, said inserting means including a plurality of insertion heads corresponding in number to the different sets of electronic components, each insertion head including means for holding electronic components of one set, said insertion heads being simultaneously operative to insert the held electronic components of different sets into each printed circuitboards.

* * * * *